United States Patent
Lee et al.

(10) Patent No.: US 7,054,202 B2
(45) Date of Patent: May 30, 2006

(54) HIGH BURST RATE WRITE DATA PATHS FOR INTEGRATED CIRCUIT MEMORY DEVICES AND METHODS OF OPERATING SAME

(75) Inventors: Yun-sang Lee, Kyungki-do (KR);
Jung-bae Lee, Kyungki-do (KR);
One-gyun La, Kyungki-do (KR);
Sung-ryul Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 231 days.

(21) Appl. No.: 10/792,425

(22) Filed: Mar. 3, 2004

(65) Prior Publication Data

US 2004/0246783 A1    Dec. 9, 2004

(30) Foreign Application Priority Data

Jun. 3, 2003    (KR) ............... 10-2003-0035604
Jun. 27, 2003    (KR) ............... 10-2003-0042840

(51) Int. Cl.
*G11C 16/04*    (2006.01)

(52) U.S. Cl. ............... 365/189.05; 365/219; 365/220; 365/221

(58) Field of Classification Search ........ 365/189.05, 365/219, 220, 221, 239, 238.5

See application file for complete search history.

(56) References Cited

U.S. PATENT DOCUMENTS

| | | | |
|---|---|---|---|
| 4,644,502 A | 2/1987 | Kawashima | |
| 4,745,577 A | 5/1988 | Ogawa et al. | |
| 4,855,959 A | 8/1989 | Kobayashi | |
| 5,854,767 A * | 12/1998 | Nishi et al. ............... | 365/219 |
| 6,144,616 A | 11/2000 | Suzuki et al. | |
| 6,427,197 B1 | 7/2002 | Sato et al. | |
| 6,459,393 B1 | 10/2002 | Nordman | |
| 2001/0005012 A1 | 6/2001 | Ohshima et al. | |

OTHER PUBLICATIONS

Combined Search and Examination Report under Section 17 and 18(3), GB Application No. GB0412446.7, Oct. 29, 2004.

* cited by examiner

*Primary Examiner*—Richard Elms
*Assistant Examiner*—Pho M. Luu
(74) *Attorney, Agent, or Firm*—Myers Bigel Sibley & Sajovec

(57) ABSTRACT

Integrated circuit memory devices include a memory cell array that is configured to write N data bits in parallel and a write data path that is configured to serially receive 2N data bits from an external terminal. The write data path includes 2N write data buffers that are configured to store the 2N data bits, 2N switches, and N data lines that are configured to connect at least N of the 2N switches to the memory cell array to write therein N data bits in parallel. A reduced number of local data lines and/or global data lines may be provided.

41 Claims, 19 Drawing Sheets

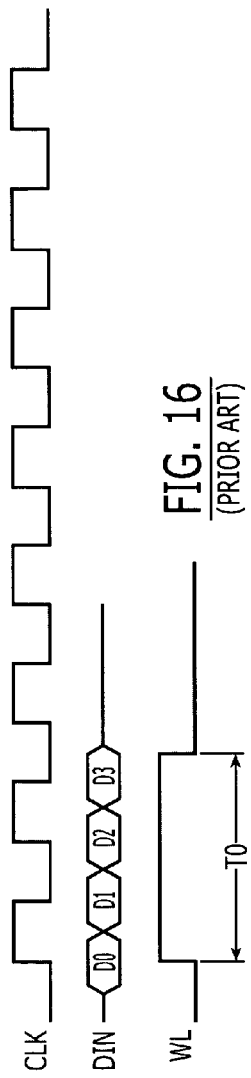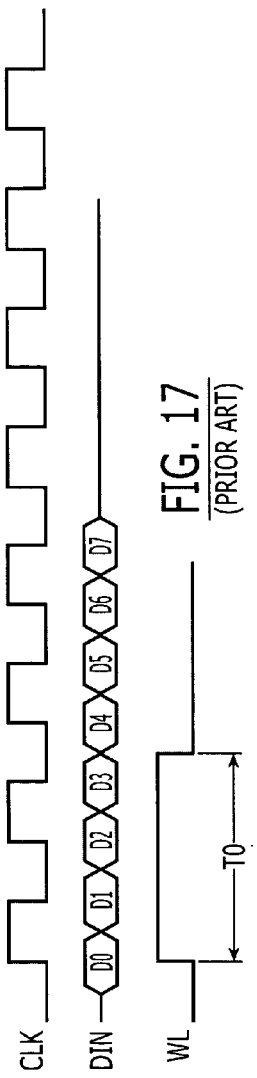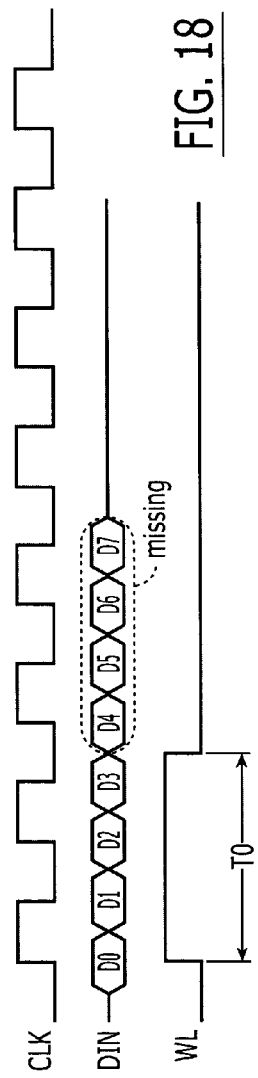
FIG. 16 (PRIOR ART)
FIG. 17 (PRIOR ART)
FIG. 18

HIGH BURST RATE WRITE DATA PATHS FOR INTEGRATED CIRCUIT MEMORY DEVICES AND METHODS OF OPERATING SAME

RELATED APPLICATION

This application claims the benefit of Korean Patent Application No. 2003-0035604, filed Jun. 3, 2003, and Korean Patent-Application No. 2003-0042840, filed Jun. 27, 2003, the disclosures of which are hereby incorporated herein by reference in their entirety as if set forth fully herein.

FIELD OF THE INVENTION

This invention relates to integrated circuit memory devices and operating methods therefor, and more specifically to write data paths for integrated circuit memory devices and operating methods therefor.

BACKGROUND OF THE INVENTION

Integrated circuit memory devices are widely used in many consumer and commercial applications. As the integration density of integrated circuit memory devices continues to increase, the number of memory cells in the integrated circuit memory devices may continue to increase. Moreover, the prefetch scheme for the integrated circuit memory devices also may continue to increase. As is well known to those having skill in the art, prefetch denotes how many simultaneous bits are written into or read from an integrated circuit memory array. The prefetch scheme may also be denoted by a burst length, i.e. how many bits are serially output or input to or from an external terminal in one operation. Many integrated circuit devices presently use a four-bit prefetch scheme, i.e., a four bit burst length. However, it may be desirable to increase to an 8-bit prefetch scheme or 8-bit burst length in order to operate a memory device at a higher data rate. In the future even higher prefetch schemes or burst lengths may be used.

Unfortunately, when increasing to a higher prefetch scheme, a write data path of the integrated circuit memory device may increase in size and/or complexity. As is well known to those having skill in the art, the write data path is used to serially receive multiple data bits from an external terminal and to provide the multiple bits to the memory cell array in parallel to write the multiple bits in the memory cell array. Thus, the write data path may take up an excessive amount of chip area.

FIG. 1 is a block diagram of a conventional Dynamic. Random Access Memory device (DRAM). DRAMs of FIG. 1 also may be referred to as a Fast Cycle DRAM (FCDRAM). As shown in FIG. 1, the FCDRAM 100 includes a clock buffer 102 that receives a clock signal and generates an internal clock signal, a command decoder 104 that generates commands from external inputs, an address buffer 106 that generates address signals from address data A0–A14 and bank selectors BA0, BA1, and a refresh counter 108. A control signal generator 110 generates control signals from the signals that are provided by the command decoder 104. A Mode Register Set (MRS) 112 generates mode signals as appropriate. An upper address latch 114 and a lower address latch 116 generate address signals that are applied to a row decoder and a column decoder, respectively. A burst counter 118 is used to control the burst length of read and write data. A write address latch/compare circuit 120 is used to compare previous and current write addresses.

Still continuing with the description of FIG. 1, four banks of memory cell arrays 122–128 may be provided. However, fewer or more banks may be provided. An input/output data path 200 includes a data control and latch circuit 130, a read data buffer 132 and a write data buffer 134 and an input/output (DQ) buffer 136. The DQ buffer 136 is responsive to a Data Mask (DM) signal that masks predetermined inputs. Operation of an FCDRAM as described in FIG. 1 is well known to those having skill in the art and need not be described further herein.

FIG. 2 is a more detailed block diagram of a data input/output path 200 of FIG. 1. As shown in FIG. 2, each of the data input/output terminals DQ0 . . . DQ15 serially receives 4 data bits that are transferred from the external terminal when the mode register 112 of FIG. 1 selects a burst length of 4. Then, each input data bit is transferred from a data input buffer 38 in the DQ buffer 136 to a serial-to-parallel (S-P) converter 30. The input data on the write data bus line (DBW) that is converted from serial-to-parallel by the serial-to-parallel converter 30, is transferred to an appropriate write data path 31, 32, 33, 34 that is selected by bank address bits BA0, BA1.

Still referring to FIG. 2, in order to read data, data is output from one of a plurality of banks Bank0–Bank3 and is transferred to the read data bus line (DBR) through a read data path 41, 42, 43, 44 that is selected by bank address bits BA0, BA1. The parallel data that is read on the DBR is then converted to serial data by a parallel-to-serial (P-S) converter 40. The serial data is then output externally through the data input and output terminals DQ0–DQ15 through the data output buffer 48. Accordingly, in some embodiments 64 bits (4 bits by 16) of input data can be written to a memory cell array of the selected memory bank at the same time and 64 bits of data can be read through the terminals DQ0–DQ15 at the same time.

FIG. 3 is a block diagram that illustrates a 4-bit prefetch scheme in a conventional FCDRAM, such as was described in connection with FIGS. 1 and 2. More specifically, referring to FIG. 3, when burst length 4 is selected by MRS 112 of FIG. 1, the first input data that is buffered from an input buffer 38 is stored in a first latch 311 of an input data latch 301 of the serial-to-parallel converter 30, in response to the rising edge of a first internal data strobe signal (PDS). The second bit of input data that is serially received is stored at a second latch 312 of the input data latch 301 of the serial-to-parallel converter 30 in response to the falling edge of the first internal data strobe signal (PDS).

At the same time, the first input data that is stored in the first latch 311 and the second input data that is stored in the second latch 312 are respectively transferred to a first register 313 and a second register 314 of a parallel converter 302 in response to a second internal data strobe signal PDSP. The third bit of input data is stored at the first latch 311 in response to the next rising edge of the first internal data strobe signal (PDS) and the fourth input data is stored in the second latch 312 in response to the next falling edge of the internal data strobe signal (PDS).

Also at the same time, the third input data bit and the fourth input data bit are respectively transferred to a third register 315 and a fourth register 316 of the parallel converter 302 in response to the rising and falling edges of the first internal data strobe signal (PDS). Thus, as shown in FIG. 3, odd input data DIN-0, such as the first and third input data bits, is consecutively transferred to the first and third registers 313 and 315 and even input data, such as the second and fourth input data bits, are transferred to the second and fourth registers 314, 316. After all input data D0, D1, D2, D3 is transferred to the parallel converter 302, all of the input data is then transferred and stored in parallel to a parallel data output circuit 303 in response to the rising edge of a third internal data strobe signal (PDSEN).

FIG. 4 is a timing diagram that illustrates the above operations including serial input of 4 data bits D0–D3 on the input DQ pad and the parallel output of the 4 data bits on output lines DBW_0–DBW_3.

Referring again to FIG. 3, the input data that is stored in the serial-to-parallel converter 30 is then stored in write data buffers 330, 331, 332 and 333 which form part of the write data path 31, 32, 33 or 34 of FIG. 2. From write data buffers 330–333, the input data is then transferred to the column select line (CSL) 350 in response to a control signal (PS4) that is applied to parallel bit switches PSW 340–343. The 4 bits of input data are written into the memory cell block 360 at the same time. Accordingly, FIGS. 3 and 4 illustrate a 4-bit prefetch scheme because 4 bits of data are written into a memory cell block at the same time. In FIG. 3, the lines that couple the write data buffers 330–333 to the parallel bit switches PSW 340–343 are referred to as Global Data Lines (GDL_0–GDL_3). The lines that couple the parallel bit switches (PSW) to the column select lines 350 are referred to as Local Data Lines (LDL_0–LDL_3). Finally, the bit lines of the memory cell array are denoted in FIG. 3 by BL_0–BL_511.

FIG. 5 is a block diagram of a conventional FCDRAM that includes an 8-bit prefetch scheme. As is well known to those having skill in the art, an 8-bit prefetch scheme may allow an FCDRAM to operate at a higher data rate. In FIG. 5, like numbers are used to designate like elements of FIG. 3. Moreover, in order to accommodate the 8-bit prefetch scheme, many of the elements of FIG. 3 are doubled in FIG. 5. Thus, a second set of registers 313'–316' is provided in the parallel converter 302, as well as a second set of registers 317'–320' in a parallel data output circuit 303. A second set of write data buffers 334–337 and a second set of parallel bit switches 344–347 also are provided.

As also shown in FIG. 5, the number of local data lines (LDL) and global data lines (GDL) are doubled compared to FIG. 3. Stated differently, in the 8-bit prefetch scheme of FIG. 5, the number of global data lines (GDL) and the number of local data lines (LDL) are increased two-fold compared to a 4-bit prefetch scheme of FIG. 3. More specifically, in FIG. 5, 8 global data lines (GDL_0–GDL_7) are used to connect a respective write data buffer 330–337 to a respective parallel bit switch 340–347. Moreover, 8 local data lines (LDL_0–LDL_7) are used to connect a respective parallel bit switch (PSW) 340–347 to the column select line 350. Unfortunately, the larger number of local and/or global data lines may increase the layout area of the integrated circuit memory device unduly.

Read and/or write data paths for other high-speed memory devices are illustrated in U.S. Pat. No. 6,144,616 to Suzuki et al. entitled "Semiconductor Memory Device"; U.S. Pat. No. 6,427,197 to Seigo et al. entitled "Semiconductor Memory Device Operating in Synchronization with a Clock Signal for High Speed Data Write and Data Read Operations"; and in published U.S. Patent Application 2001/0005012 to Ochuma et la. entitled "Fast Cycle Ram Having Improved Data Write Operation".

SUMMARY OF THE INVENTION

Integrated circuit memory devices according to some embodiments of the present invention include a memory cell array that is configured to write therein N data bits in parallel and a write data path that is configured to serially receive 2N data bits from an external terminal. The write data path includes 2N write data buffers that are configured to store the 2N data bits, 2N switches, and N data lines that are configured to connect at least N of the 2N switches to the memory cell array to write therein N data bits in parallel. A reduced number of local data lines and/or global data lines may be provided.

In some embodiments of the present invention, the write data path includes first and second serial-to-parallel converters that are connected to the external terminal, N first global data lines and N second global data lines. In some embodiments, the first serial-to-parallel converter is responsive to a first set of internal data strobe signals and the second serial-to-parallel converter is responsive to a second set of internal data strobe signals. In other embodiments, the first serial-to-parallel converter and the second serial-to-parallel converter are both responsive to a same set of internal data strobe signals. The 2N write data buffers comprise N first write data buffers and N second write data buffers, and the 2N switches comprise N first switches and N second switches. In these embodiments, the N first data write buffers are connected to the first serial-to-parallel converter, and a respective one of the N first global data lines is connected between a respective one of the N first switches and a respective one of the N first write data buffers. In these embodiments, the N second write data buffers are connected to the second serial-to-parallel converter, and a respective one of the N second global data lines is connected between a respective one of the N second switches and a respective one of the N second write data buffers. Moreover, in these embodiments, the N data lines are N local data lines and a respective one of the N local data lines is connected between a respective one of the N first switches, a respective one of the N second switches and the memory cell array.

In these embodiments, the write data path may also comprise first and second data ordering circuits, a respective one of which is connected between a respective one of the first and second serial-to-parallel converters and a respective one of the N first write data buffers and the N second write data buffers. Moreover, in these embodiments, the N first switches may be responsive to a first control signal and the N second switches may be responsive to a second control signal that is delayed in time from the first control signal. The first and second control signals may be generated with different delays from a write active signal.

These embodiments also may include a command decoder that is responsive to a chip select command and a function command, to generate the write active signal, and a control signal generation circuit that is responsive to the write active signal and is configured to generate the first and second control signals. The command decoder may be further configured to generate an active command and a read command in response to the chip select command and the function command. In some embodiments, the command decoder is further configured to generate a read command, a refresh command and a mode reset command in response to the chip select command and the function command.

These embodiments may also include N third switches and N fourth switches. A respective one of the N third switches is connected between the first serial-to-parallel converter and a respective one of the N first write data buffers. A respective one of the N fourth switches is connected between the second serial-to-parallel converter and a respective one of the second write data buffers. In some embodiments, the N third switches are responsive to a third control signal and the N fourth switches are responsive to a fourth control signal that is delayed in time from the third control signal. The third and fourth control signals may be generated from respective offset falling edges of a data strobe signal. Finally, a data strobe counter may be responsive to the data strobe signal and may be configured to count falling edges of the data strobe signal and to generate the third and fourth control signals from respective offset falling edges of the data strobe signal.

In other embodiments of the present invention, the write data path comprises a serial-to-parallel converter that is connected to the external terminal and N global data lines. In these embodiments, the 2N write data buffers comprise N first write data buffers and N second write data buffers, and the 2N switches comprise N first switches and N second switches. The N first write data buffers are connected to the serial-to-parallel converter and a respective one of the N first write data buffers is connected to a respective one of the N first switches. A respective one of the N second write data buffers is connected to a respective one of the N first switches and a respective one of the N global data lines is connected between a respective one of the N second switches and a respective one of the N second write data buffers. Finally, a respective one of the N local data lines is connected between a respective one of the N second switches and a memory cell array.

In some of these other embodiments, the write data path further comprises a data ordering circuit that is connected between the serial-to-parallel converter and a respective one of the N first write data buffers. Moreover, some of these other embodiments include N third switches, a respective one of which is connected between the serial-to-parallel converter and a respective one of the N first write data buffers. Moreover, the N third switches may be responsive to a first control signal and the N first switches may be responsive to a second control signal that is delayed in time from the first control signal. The first and second control signals may be generated from respective offset falling edges of the data strobe signal.

Yet other embodiments of the present invention also include a precharge control circuit that activates a word line of a memory cell array for a sufficient time to write the 2N data bits into the memory cell array as two groups of N parallel bits. In some embodiments, the precharge control circuit activates a word line of the memory cell array for a sufficient time to write the 2N data bits into the memory cell array as two groups of N parallel bits in a first precharge mode of the integrated circuit memory device. The precharge control circuit activates a word line of the memory cell array for a sufficient time to write the N data bits into the memory cell array as one group of N parallel bits in a second precharge mode of the integrated circuit memory device. A mode register set may be configured to select the first or second precharge mode, wherein the precharge control circuit is responsive to the mode register set.

In some embodiments, the precharge control circuit comprises first and second delay elements. The first delay element is responsive to a first precharge mode signal, has a first delay and is configured to activate the word line of the memory cell array for a sufficient time to write the 2N data bits into the memory cell array as two groups of N parallel bits. The second delay element is responsive to a second precharge mode signal, has a second delay that is shorter than the first delay and is configured to activate the word line of the memory cell array for a sufficient time to write the N data bits into the memory cell array as one group of N parallel bits.

According to other embodiments of the invention, at least one of the write data buffers comprises an address latch that is configured to latch a write address, an address comparator that is configured to compare a current address with the write address that is latched in the address latch and a data latch that is configured to latch the write data corresponding to the write address therein. In some embodiments, the current address is a read address and the integrated circuit memory device is further configured to output read data to the external terminal from the data latch rather than from the memory cell array, when the address comparator determines that the read address matches the write address that is latched in the address latch. In other embodiments, the integrated circuit memory device is further configured to output read data to the external terminal from the memory cell array, when the address comparator determines that the read address does not match the write address that is latched in the address latch.

Accordingly, integrated circuit memory devices according to various embodiments of the invention include a memory cell array that is configured to store therein a plurality of data bits in parallel. A write data path is configured to serially receive twice the plurality of data bits from an external terminal, to write a first half of the data bits into the memory cell array in parallel and to subsequently write a second half of the data bits into the memory cell array in parallel.

Integrated circuit memory devices having a memory cell array that is configured to store therein a plurality of data bits in parallel may be operated, according to various embodiments of the invention, by serially receiving twice the plurality of data bits from an external terminal. The data bits that are received are stored in a plurality of write data buffers. A first half of the data bits are written from the write data buffers into the memory cell array in parallel. Then, a second half of the data bits are written from the write data buffers into the memory cell array in parallel.

In some embodiments, twice the plurality of data bits are received from an external terminal by serially receiving the first half of the data bits and then serially receiving the second half of the data bits. The data bits are stored by storing the first half of the data bits in a first set of write data buffers and storing the second half of the data bits in a second set of write data buffers. Finally, writing the first half of the data bits and writing the second half of the data bits are performed from the respective first and second sets of write data buffers over a common set of local data lines.

According to other embodiments of the present invention, twice the plurality of data bits are serially received from an external terminal by serially receiving the first half of the data bits and then serially receiving the second half of the data bits. The data bits are stored in the write data buffers by storing the first half of data bits in a first set of write data buffers, shifting the first half of the data bits from the first set of write data buffers to a second set of write data buffers and storing the second half of the data bits in the first set of write data buffers. The first half of the data bits are written from the second set of write data buffers into the memory cell array. The second half of the data bits are shifted from the first set of write data buffers to the second set of write data buffers and the second half of the data bits are then written from the second set of write data buffers into the memory cell.

BRIEF DESCRIPTION OF THE DRAWINGS

FIG. 16 is a timing diagram for a conventional precharge control circuit.

FIG. 17 illustrates a conventional technique for enabling a word line in an eight-bit prefetch scheme.

FIG. 18 illustrates a precharging timing diagram according to some embodiments of the present invention.

DETAILED DESCRIPTION

Figure 1:
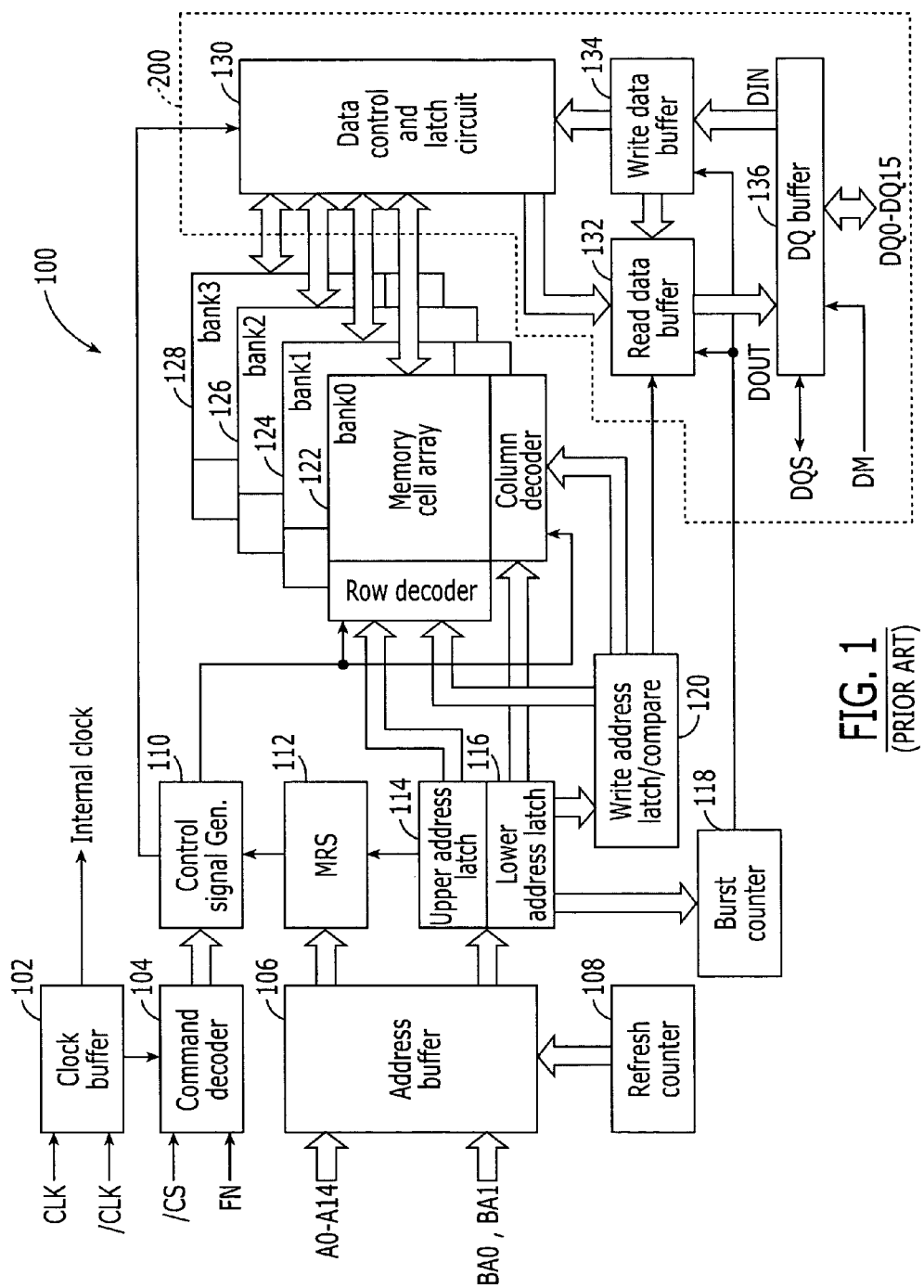
FIG. 1 is a block diagram of a conventional dynamic random access memory device.
Figure 2:
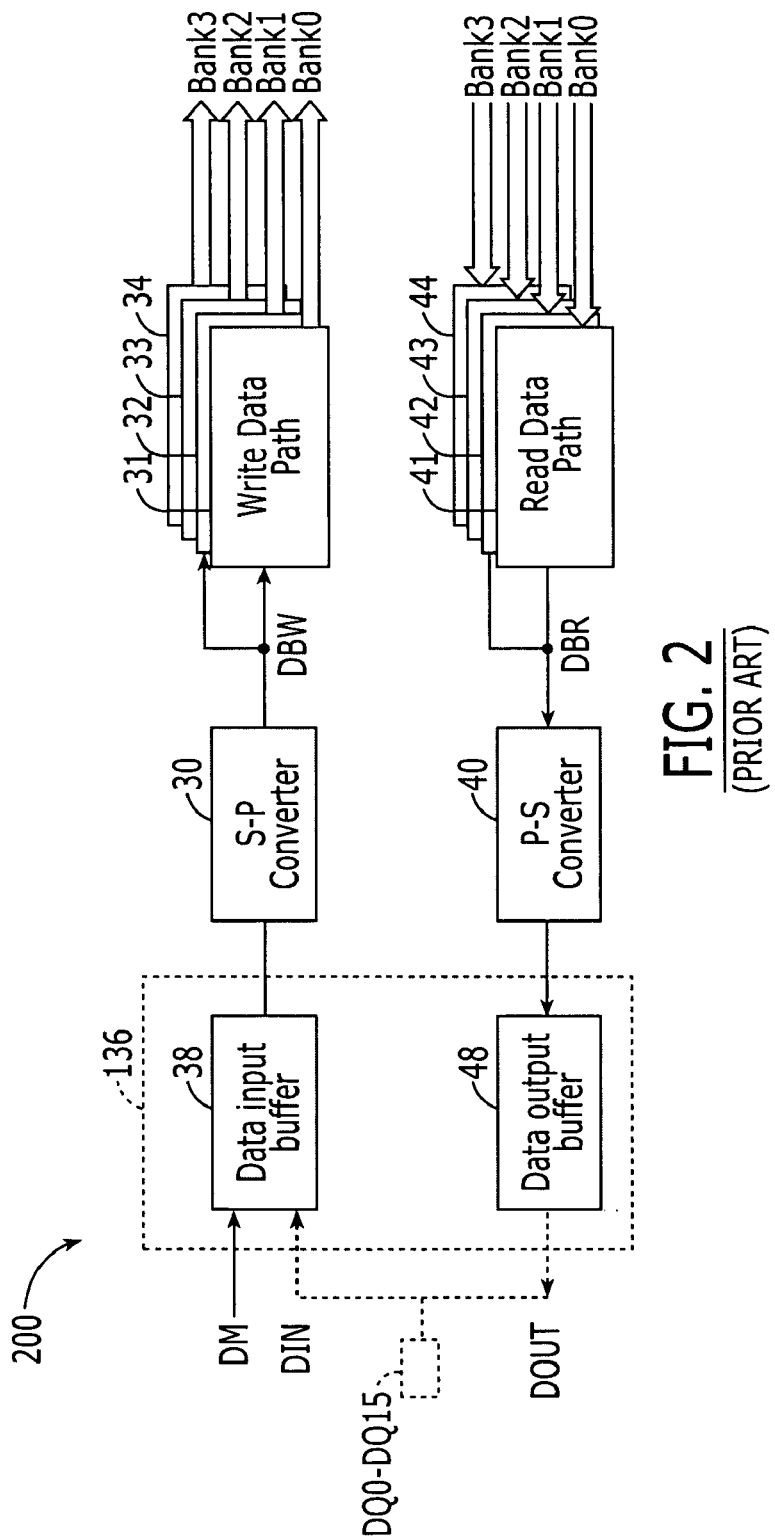
FIG. 2 is a more detailed block diagram of a data input/output path of FIG. 1.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of elements may be exaggerated for clarity. Moreover, each embodiment described and illustrated herein includes its complementary conductivity type embodiment as well. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that although the terms first, second, etc. are used herein to describe various elements, these elements should not be limited by these terms. These terms are only used to distinguish one element from another element. Thus, a first element discussed below could be termed a second element and similarly, a second element may be termed a first element without departing from the teachings of the present invention.

Figure 6:
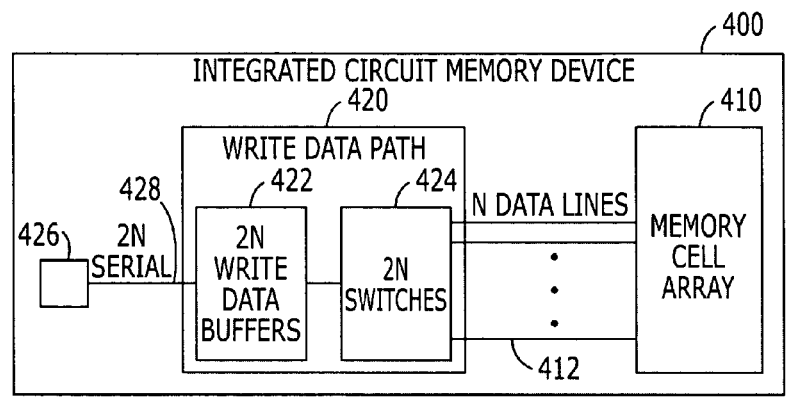
FIG. 6 is a block diagram of integrated circuit memory devices according to various embodiments of the present invention.

FIG. 6 is a block diagram of integrated circuit memory devices according to various embodiments of the present invention. As shown in FIG. 6, these integrated circuit memory devices 400 include a memory cell array 410 that is configured to write therein N data bits in parallel. A write data path 420 is configured to serially receive 2N data bits from an external terminal 426 over a serial line 428. As shown in FIG. 6, the write data path 420 comprises 2N write data buffers 422 that are configured to store the 2N data bits that are received on line 428, and 2N switches 424. N data lines 412 also are provided that are configured to connect at least N of the 2N switches to the memory cell array 410 to write therein N data bits in parallel.

FIG. 6 also illustrates embodiments of the present invention wherein an integrated circuit memory device 400 includes a memory cell array 410 that is configured to store therein a plurality of data bits in parallel. A write data path 420 is configured to serially receive twice the plurality of data bits from an external terminal 426, to write a first half of the data bits into the memory cell array in parallel and to subsequently write a second half of the data bits into the memory cell array in parallel.

FIG. 6 also illustrates methods of operating an integrated circuit memory device 400, according to various embodiments of the present invention, by serially receiving twice the plurality of data bits from an external terminal 426, storing the data bits that are received in a plurality of write data buffers 422, writing a first half of the data bits from the write data buffers 422 into the memory cell array 410 in parallel and then writing a second half of the data bits from the write data buffers 422 into the memory cell array 410 in parallel.

Figure 7:
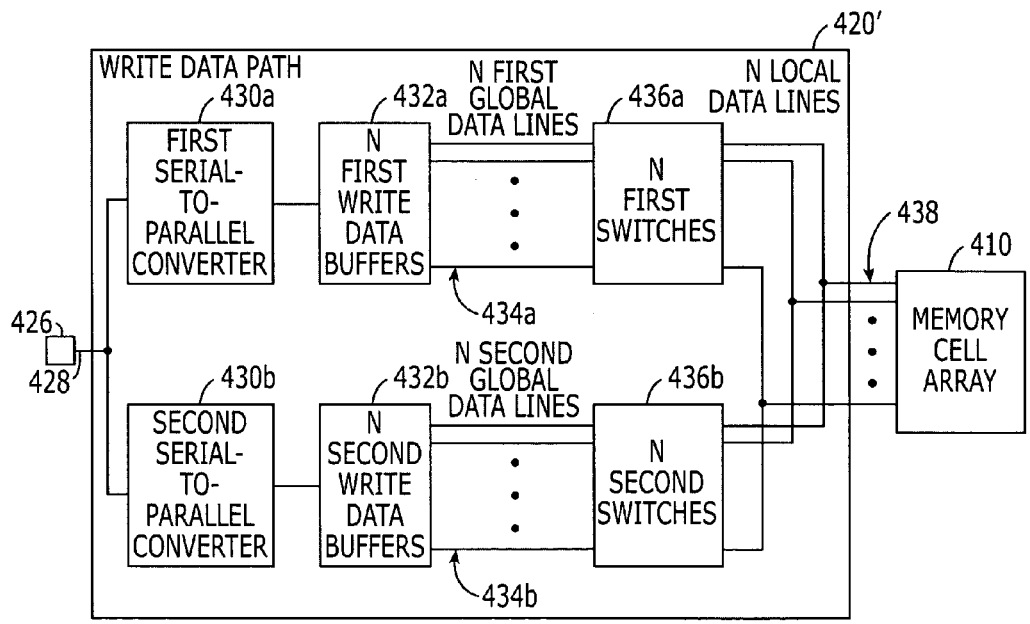
FIGS. 7 and 8 are block diagrams of write data paths according to various embodiments of the present invention.
Figure 8:
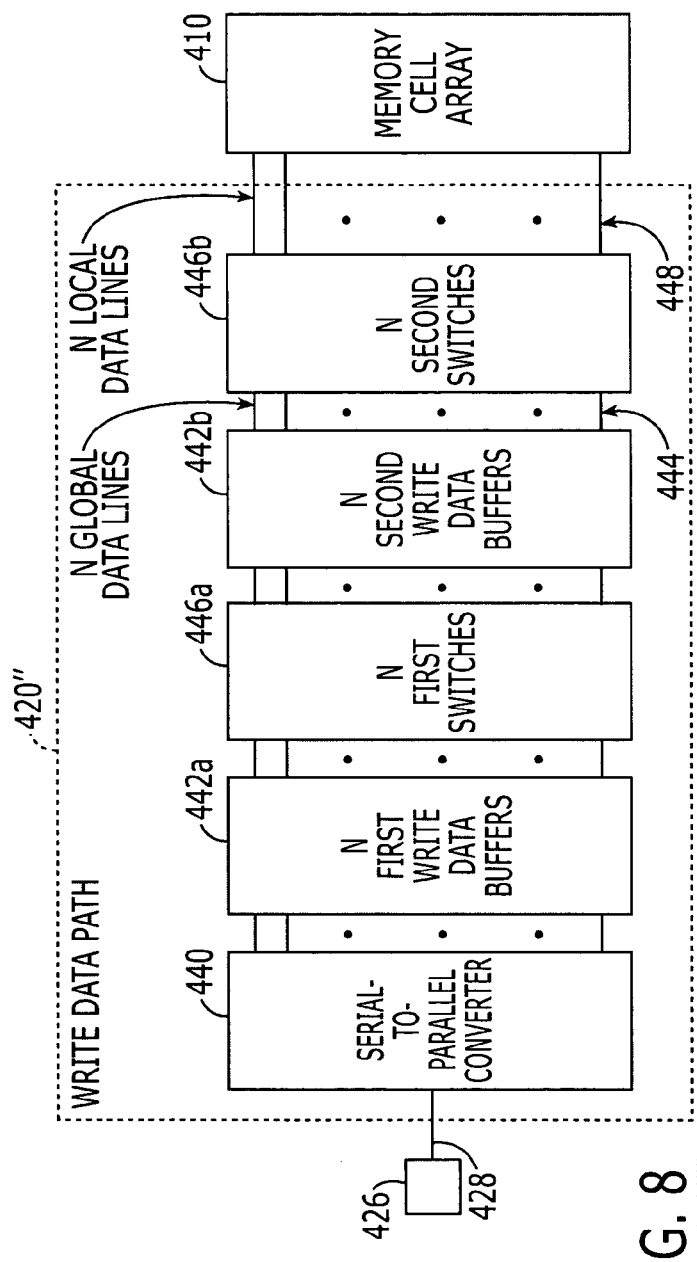

FIGS. 7 and 8 are block diagrams of write data paths according to various embodiments of the present invention. Embodiments of FIG. 7 may also be referred to herein as first embodiments of the invention, and will be described in detail in connection with FIGS. 9–12. Embodiments of FIG. 8 may also be referred to herein as second embodiments of the present invention, and will be described in greater detail in connection with FIGS. 15 and 21.

Referring now to FIG. 7, in these embodiments, the write data path 420' comprises first and second serial parallel converters 430a, 430b that are connected to the external terminal 426 via line 428. N first global data lines 434a and N second global data lines 434b also are provided. The 2N write data buffers 422 of FIG. 6 comprise N first write data buffers 432a and N second write data buffers 432b. Moreover, the 2N switches 424 of FIG. 6 comprise N first switches 436a and N second switches 436b. As shown in FIG. 7, the N first write data buffers 432a are connected to the first serial-to-parallel converter 430a, and a respective one of the N first global data lines 434a is connected between a respective one of the N first switches 436a and a respective one of the first write data buffers 432a. Similarly, as shown in FIG. 7, the N second write data buffers 432b are connected to the second serial-to-parallel converter 430b and a respective one of the N second global data lines 434b is connected between a respective one of the N second switches 436b and a respective one of the N second write data buffers 432b. Finally, as also shown in FIG. 7, the N data lines 412 of FIG. 6 are N local data lines 438. A respective one of the N local, data lines 438 is connected between a respective one of the N first switches 436a, a respective one of the N second switches 436b and the memory cell array 410.

Still referring to FIG. 7, operationally, the first half of the data bits are received from the external terminal 426 and stored in the first serial-to-parallel converter 430a, and the second half of the data bits that are serially received from the external terminal 426 are received in the second serial-to-parallel converter 430b. The first half of the data bits are stored in a first set of write data buffers 432a and the second half of the data bits are stored in a second set of write data buffers 432b. The first half of the data bits are then written from the first write data buffers 432a into the memory cell array 410 and the second half of the data bits are written from the second write data buffers 432b into the memory cell array 410 over a common set of local data lines 438.

FIG. 8 is a block diagram of write data paths according to other embodiments of the present invention, which may also be referred to as second embodiments of the present invention. As shown in FIG. 8, these write data paths 420" include a serial-to-parallel converter 440 that is connected to the external terminal 426. N first write data buffers 442a and N second write data buffers 442b are provided. N first switches 446a and N second switches 446b also are provided. The N first write data buffers 442a are connected to the serial-to-parallel converter 440 and a respective one of the N first write data buffers 442a is connected to a respective one of the N first switches 446a. Moreover, a respective one of the N second write data buffers 442b is connected to a respective one of the N first switches 446a. A respective one of N global data lines 444 is connected between a respective one of the N second switches 446b and a respective one of the N second write data buffers 442b. Finally, a respective one of the N local data lines 448 is connected between a respective one of the N second switches 446b and the memory cell array 410.

FIG. 8 also illustrates operational methods for these embodiments of the present invention, wherein a first half of the data bits is serially received from the external terminal 426 and then the second half of the data bits is serially received from the external terminal 426. The first half of the data bits are stored in the first set of write data buffers 442a and shifted from the first set of write data buffers 442a to the second set of write data buffers 442b via the N first switches 446a while the second half of the data bits are stored in the first set of write data buffers 442a. The first half of the data bits are written from the second set of write data buffers 442b into the memory cell array 410 via the N second-switches 446b. The second half of the data bits are shifted from the first set of write data buffers 442a to the second set of write data buffers 442b via the N first switches 446a, and then written into the memory cell array 410 via the N second switches 446b. Accordingly, FIG. 8 illustrates a pipelining method of writing data, wherein 2N data bits are stored in the write data path 420" and N bits are written parallel into the memory cell array 410.

Figure 9A:
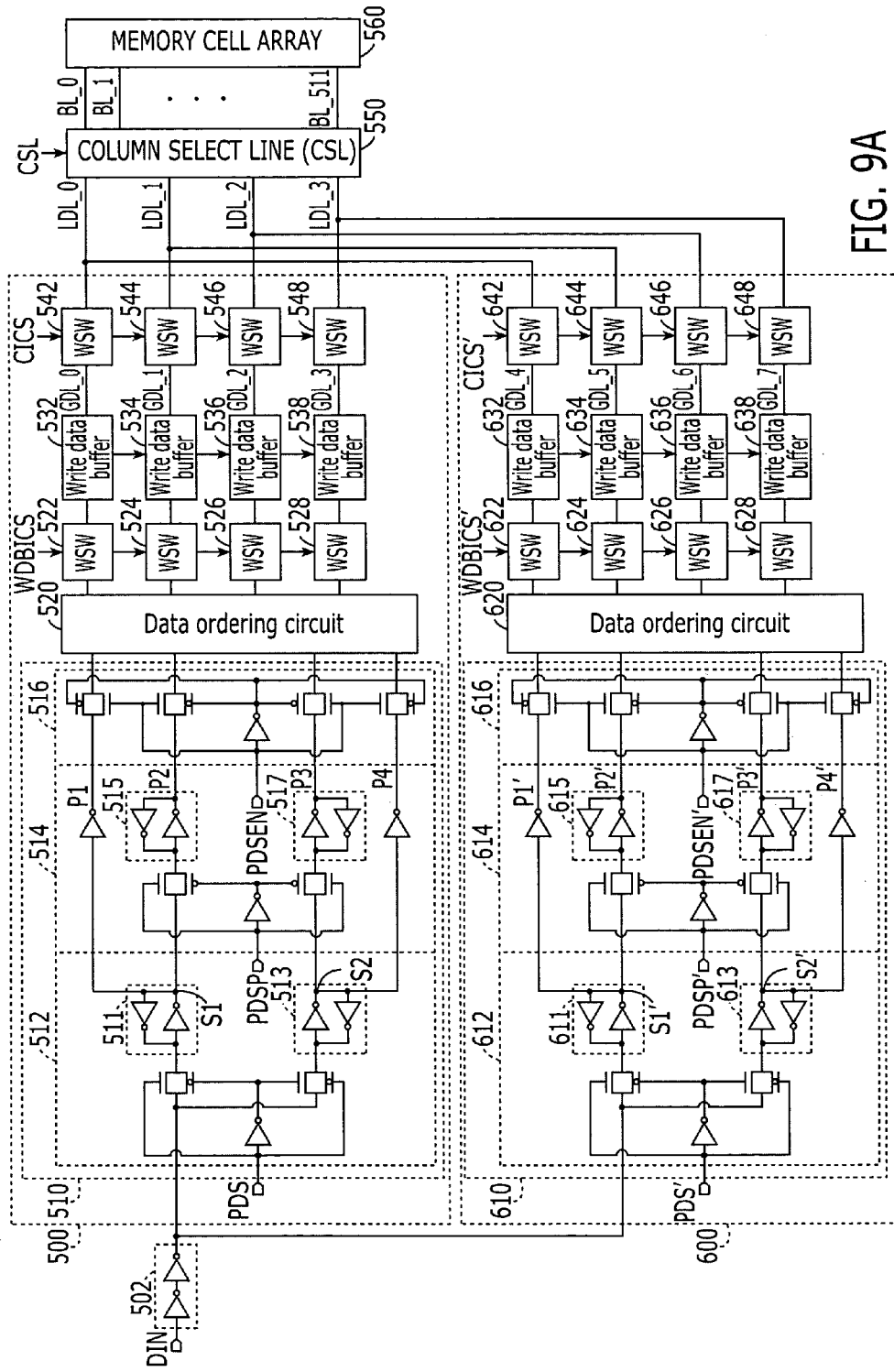
FIGS. 9A and 9B are more detailed block diagrams of integrated circuit memory devices which are described generally in FIG. 7.
Figure 9B:
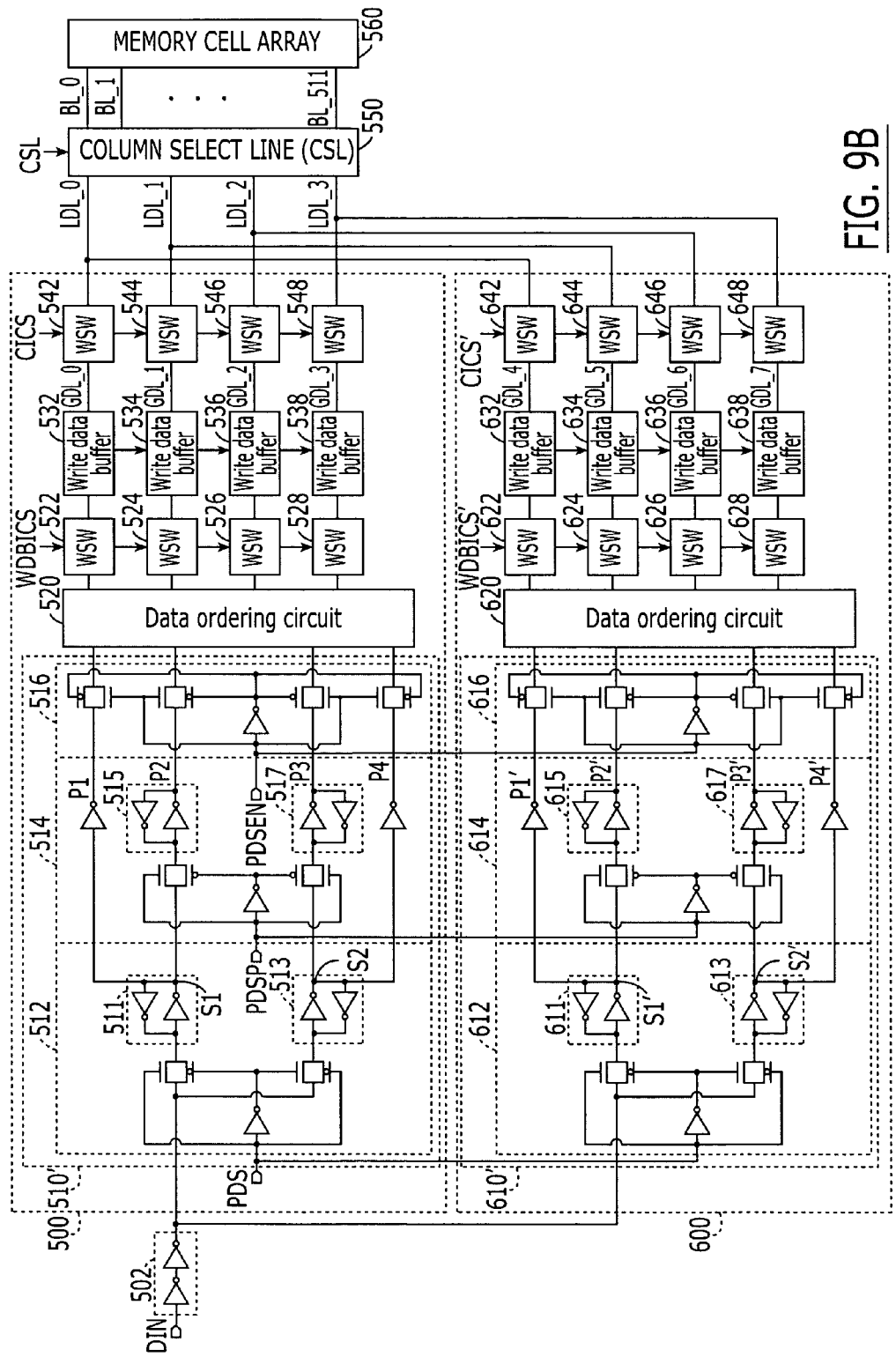

FIGS. 9A and 9B are more detailed block diagrams of integrated circuit memory devices according to some embodiments of the present invention, also referred to herein as first embodiments of the present invention, which were described generally in FIG. 7. In FIGS. 9A and 9B, embodiments are shown for implementing an 8 bit prefetch operation with burst length 4 scheme (BL=4). However, it will be understood by those having skill in the art that other embodiments may use smaller or larger prefetch schemes. As also shown in FIGS. 9A and 9B, notwithstanding the presence of an 8 bit prefetch operation, 8 global data lines GDL_0–GDL_7 are used, but only 4 local data lines LDL_0–LDL3 are used. Accordingly, the layout area of the memory device may decrease compared, for example, to those shown in FIG. 5, even though an 8 bit prefetch operation is performed.

Referring now to FIG. 9A, a burst length 8 (BL8) is selected by a Mode Register Set (MRS), and 8 bits of input data corresponding to BL8 are serially received in a buffer 502. The first bit of input data that is generated from the buffer 502 is stored in a first latch 511 of a first input data latch circuit 512 in response to the rising edge of the first internal data strobe signal (PDS). The second input data bit is stored in a second latch 513 of the first input data latch circuit 512 in response to the falling edge of the first internal data strobe signal PDS. After the two input data bits are stored in the first input data latch circuit 512, the first input data in the first latch 511 and the second input data in the second latch 513 are respectively transferred to a third latch 515 and a fourth latch 517 of a parallel converter 514 at the same time in response to a second internal data strobe signal (PDSP) that is generated from the first falling edge of the PDS signal.

Continuing to refer to FIG. 9A, the third input data bit is then stored in the first latch 511 of the first input data latch circuit 512 in response to the second rising edge of the first internal data strobe signal (PDS) and the fourth input data-bit is stored in the second latch 513 of the first input data latch circuit 512 in response to the second falling edge of the PDS signal. At the same time, the third input data bit and the fourth input data bit are respectively transferred to a P1 node and a P4 node of the parallel converter 514 in response to the second rising and second falling edges of the PDS signal, respectively. Thus, 4 bits of serial input data are converted into 4 bits of parallel input data as shown by the designations P1–P4 in the parallel converter 514. Then, the parallel data output 516 outputs the 4 bit input data to a data ordering circuit 520. The data ordering circuit determines the output order of the 4 bit parallel input data. It will be understood, however, that some embodiments of the present invention may not use a data ordering circuit 520. The 4 bit parallel data P1–P4 is stored in respective write data buffers 532, 534, 536, 538 in response to a first write control signal WDBICS that is applied to a plurality of write switches (WSW) 522–528. The first write control signal WDBICS is generated from a data strobe counter as will be described in connection with FIG. 10.

Still continuing with the description of FIG. 9A, the fifth input data bit generated from the buffer 502 is stored in a fifth latch 611 of a second input data latch circuit 612 in response to the rising edge of the fourth internal data strobe signal PDS'. The sixth input data bit is stored in a sixth latch 613 of the second input data latch circuit 612 in response to the falling edge of the fourth internal data strobe signal PDS'. After the fifth and sixth input data bits are stored in the input data latch circuit 612, the fifth and sixth data bits in the fifth and sixth latches 611 and 613 are respectively transferred to a seventh latch 615 and an eighth latch 617 of the parallel converter 614 at the same time, in response to a fifth internal data strobe signal (PDSP') that is generated from the first falling edge of the PDS' signal.

Then, the seventh input data bit is stored in the fifth latch 611 in response to the second rising edge of the fourth internal data strobe signal (PDS') and the eighth input data bit is stored in the sixth latch 613 in response to the second falling edge of PDS'. At the same time, the seventh and eighth input data bits are respectively transferred to a P1' node and a P4' node of a parallel converter 614 in response to the second rising edge and second falling edge of the PDS' signal. Thus, the fifth through eighth serially received bits are converted to fifth through eighth parallel bits P1'–P4'. The parallel data output 616 outputs the 4 bits of parallel input data to a data ordering circuit 620 which can determine the output order of the 4-bit parallel input data. As was described above, some embodiments may not use a data ordering circuit 620.

The 4-bit parallel data is then stored in a plurality of write data buffers 632–638 in response to a second write control signal WDBICS'. The second write control signal WDBICS' may be generated from a data strobe counter as will be described in FIG. 10. Accordingly, 8 bits of serially received data are converted into 8 bits of parallel data and stored in 8 write data buffers 532–538 and 632–638.

Accordingly, in embodiments of the invention that were described above in connection with FIG. 9A, a first serial-to-parallel converter 510 is responsive to a first set of internal data strobe signals, such as the signals PDS, PDSP and PDSEN, and a second serial-to-parallel converter 610 is responsive to a second set of internal data strobe signals, for example signals PDS', PDSP' and PDSEN'. In contrast, referring now to FIG. 9B, a first serial-to-parallel converter 510' and a second serial-to-parallel converter 610' are both responsive to a same set of internal data strobe signals, such as the signals PDS, PDSP and PDSEN.

Operations of FIGS. 9A and 9B may then proceed identically, as now will be described. In particular, after the 8 bits of serial input data are stored in the 8 write data buffers, the first 4 bits of parallel input data that are stored in the first set of write data buffers 532–538 are transferred to respective local data lines (LDL_0–LDL_3) and the bit lines BL of the memory cell array 560 are written to the selected memory cells in response to a first switching signal (CICS) that is applied to a plurality of control switches (CSW) 542–548 and a column select line (CSL) signal that is applied to a column select line 550. After that, the second half of the 4-bit parallel input data that is stored in the second set of write data buffers 632–638 is also transferred to a respective local data line (LDL_0–LDL_3) in response to the second switching signal (CICS') that is applied to a second set of control switches (CSW) 642–648.

As used herein, CSW 542–548 may also be referred to as first switches and CSW 642–648 also may be referred to as second switches. Moreover, WSW 522–528 may be referred to herein as third switches and WSW 622–628 may be referred to herein as fourth switches.

Accordingly, as shown in FIGS. 9A and 9B, only 4 local data lines (LDL_0–LDL_3) are used in these embodiments of the present invention, along with 8 global data lines (GDL_0–GDL_7). Integrated circuit layout area may be reduced compared to a conventional write data path for an 8 bit prefetch which uses 8 global data lines and 8 local data lines.

Figure 10:
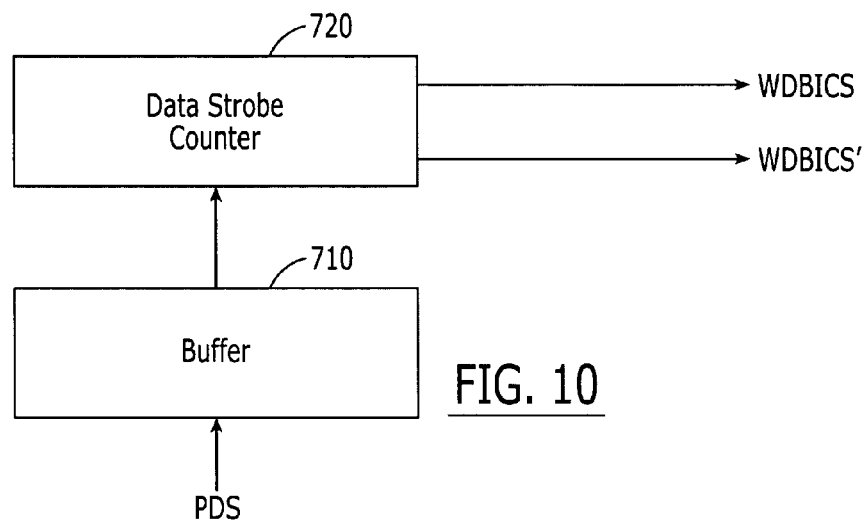
FIG. 10 is a block diagram illustrating generation of write control signals according to embodiments of the present invention.

FIG. 10 is a block diagram illustrating the generation of the first write control signal (WDBICS) and the second write control signal (WDBICS') according to some embodiments of the present invention. As shown in FIG. 10, the write control signals may be generated by a buffer 710 that is responsive to the first data strobe signal (PDS), and a data strobe counter 720 that is responsive to the buffer 710 to count the number of rising and falling edges of the first data strobe signal (PDS) and generate the first write control signal (WDBICS) from the second falling edge of the data strobe signal and the second write control signal (WDBICS') from the fourth falling edge of the data strobe signal. The PDSEN and PDSEN' signals also may be generated using these embodiments.

Figure 11:
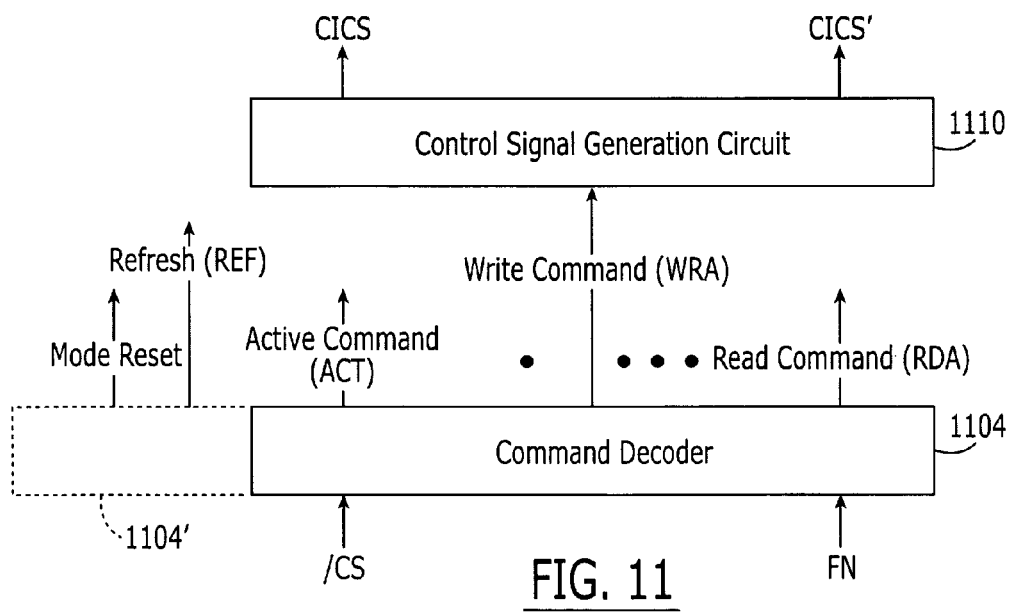
FIG. 11 is a block diagram illustrating generation of switching signals according to embodiments of the invention that were illustrated in FIG. 9.

FIG. 11 is a block diagram illustrating generation of switching signals according to various embodiments of the invention that were illustrated in FIG. 9. As shown in FIG. 11, the switching signals may be generated using a command decoder 1104 that is responsive to the chip select (/CS) and function (FN) signals and which may generate an active command (ACT) signal, a read command (RDA) signal and a write command (WRA) signal. A control signal generation circuit 1110 is configured to generate the first and second switching signals (CICS, CICS') in response to the write command signal, with a predetermined time interval.

Still referring to FIG. 11, in other embodiments of the present invention, the command decoder 1104 also may be configured as shown in the dashed portion 1104', to also generate a mode reset command and a refresh (REF) command in response to the chip select and function signals that are provided to the command decoder 1104.

Figure 3:
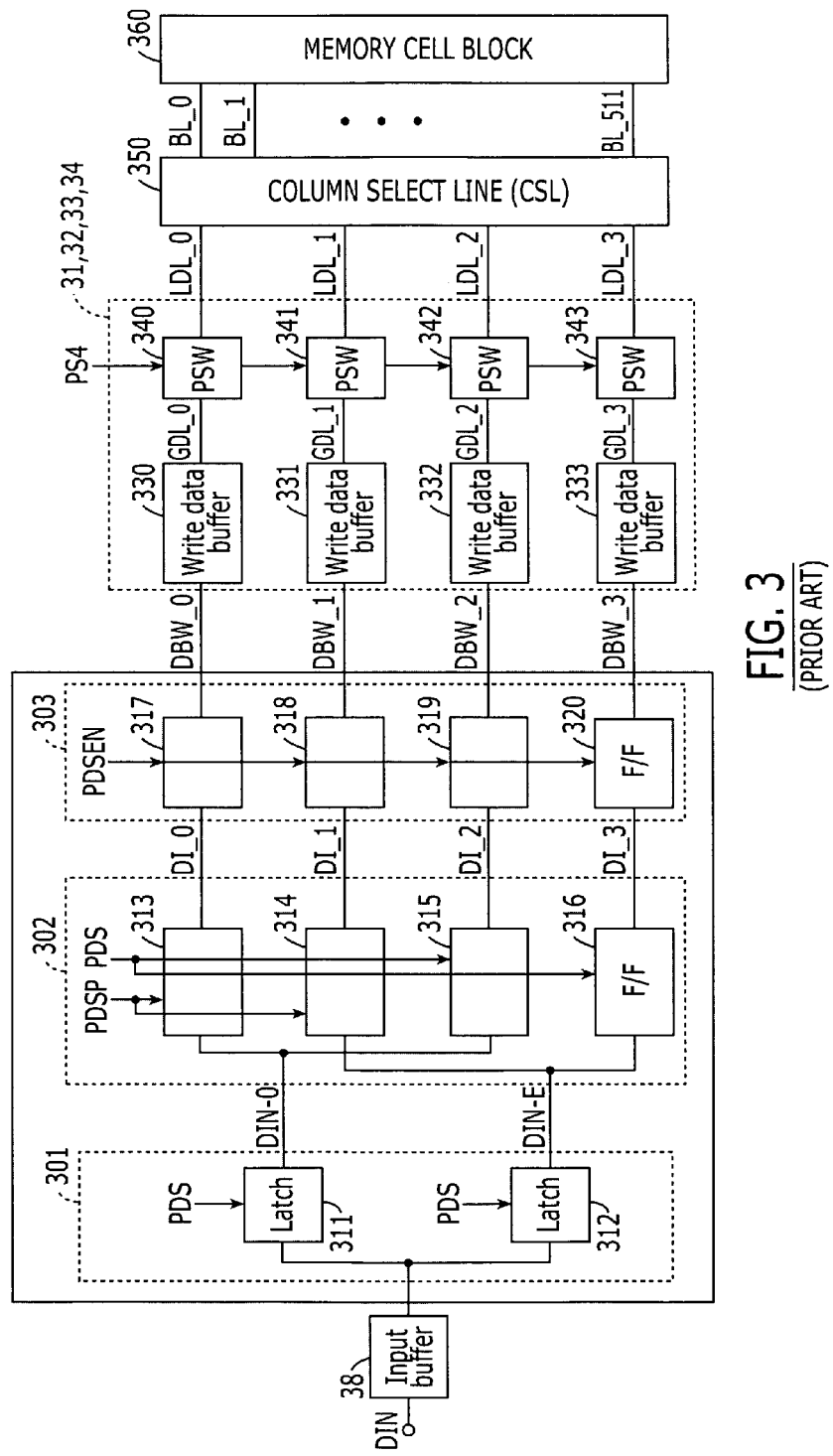
FIG. 3 is a block diagram that illustrates a four-bit-prefetch scheme in a conventional fast cycle dynamic random access memory.
Figure 4:
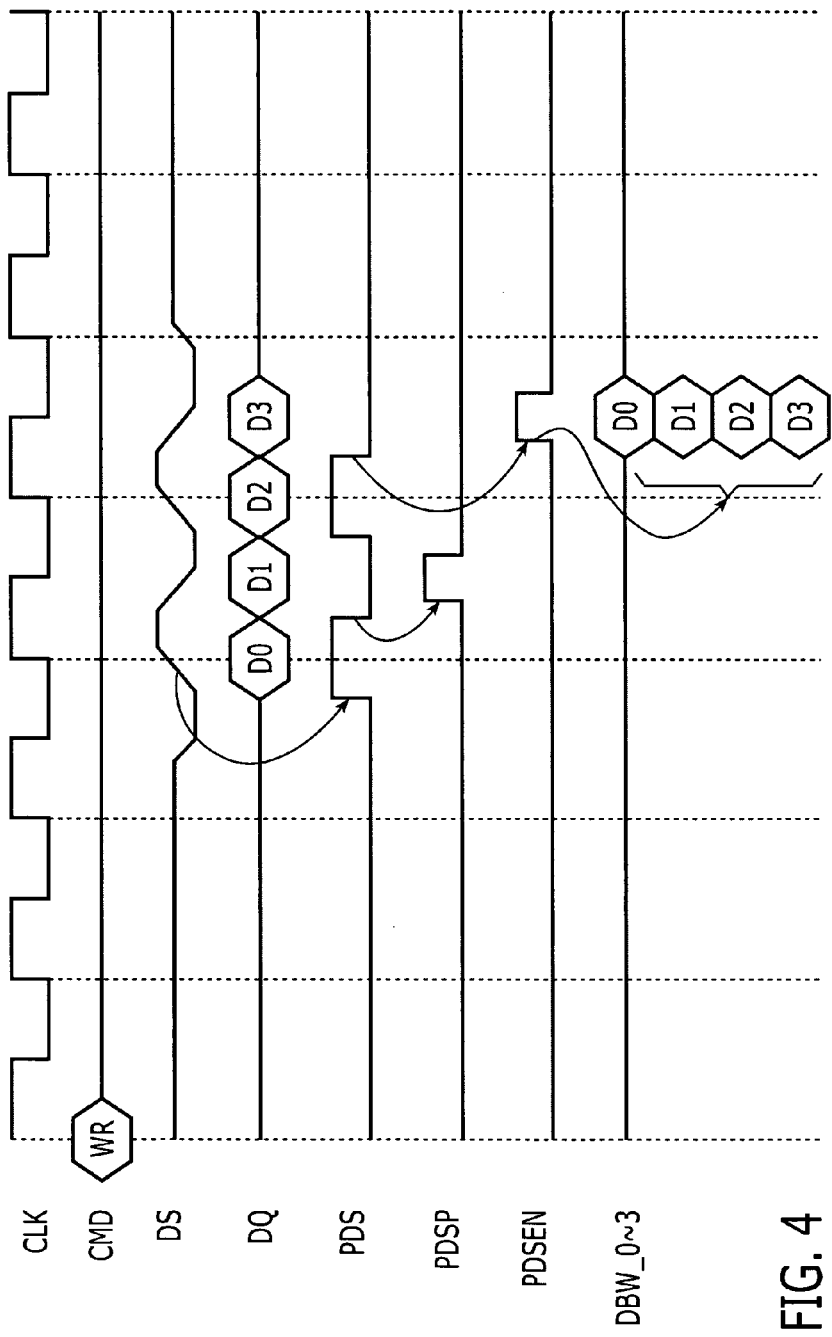
FIG. 4 is a timing diagram that illustrates operations of devices of FIG. 3.
Figure 12A:
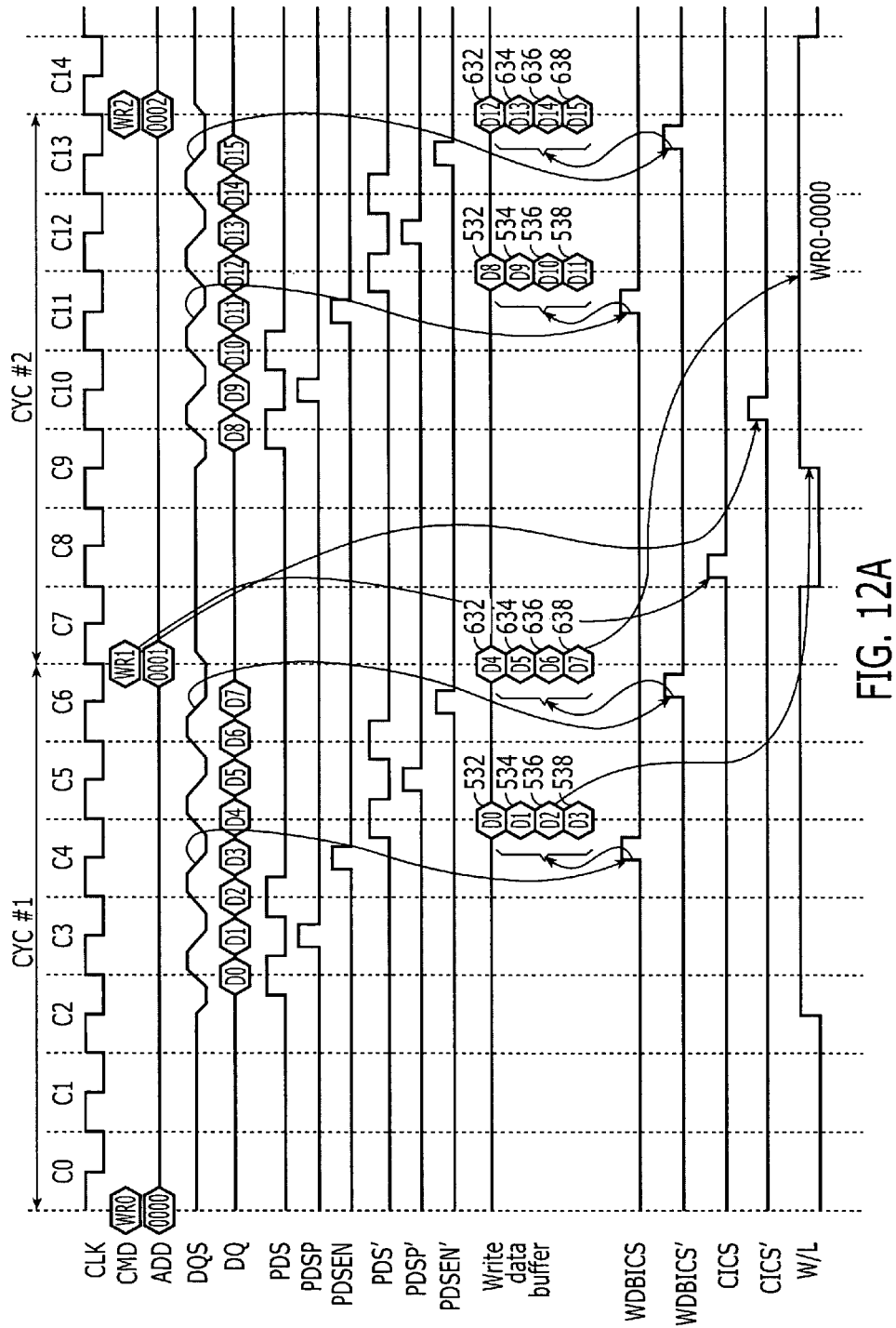
FIGS. 12 and 12B are timing diagrams illustrating operations that may be performed in an eight-bit prefetch operation according to embodiments of the present invention that were described in FIGS. 7 and 9A–11.
Figure 12B:
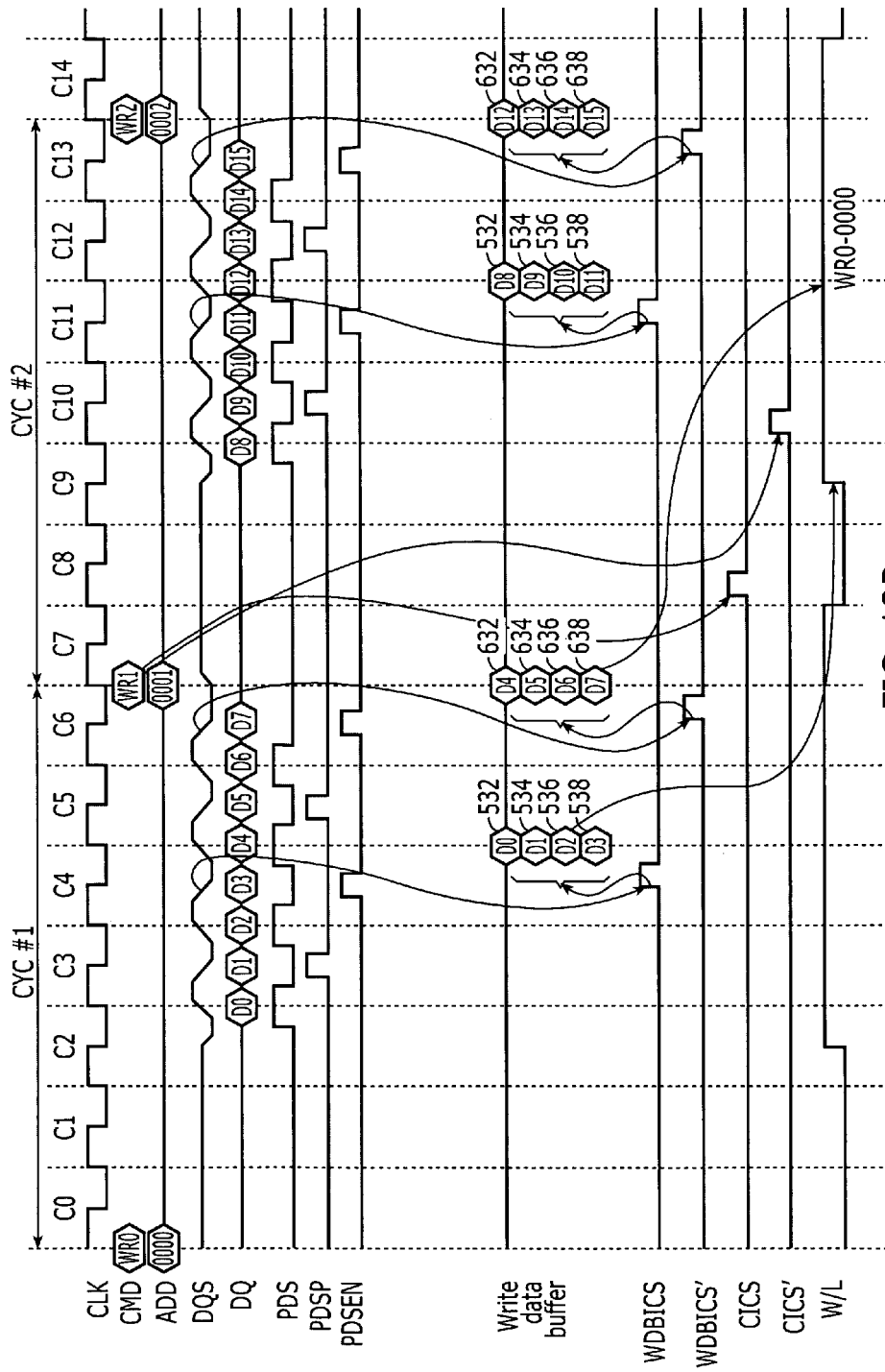

FIGS. 12A and 12B are timing diagrams illustrating operations that may be performed in an 8-bit prefetch operation according to embodiments of the present invention that were described in FIGS. 7 and 9A–11. More specifically, FIG. 12A is a timing diagram for FIG. 9A, and FIG. 12B is a timing diagram for FIG. 9B. These timing diagrams illustrate various control signals that were described in these figures as well as operations of the write data buffers 532–538 and 632–638 that were described above. For purposes of contrast, FIGS. 13–14 are timing diagrams illustrating 4 bit prefetch operations in an FCDRAM such as was described in connection with FIG. 3 above and a 4-bit prefetch in a dual data rate synchronous DRAM (DDRS-DRAM).

Figure 13:
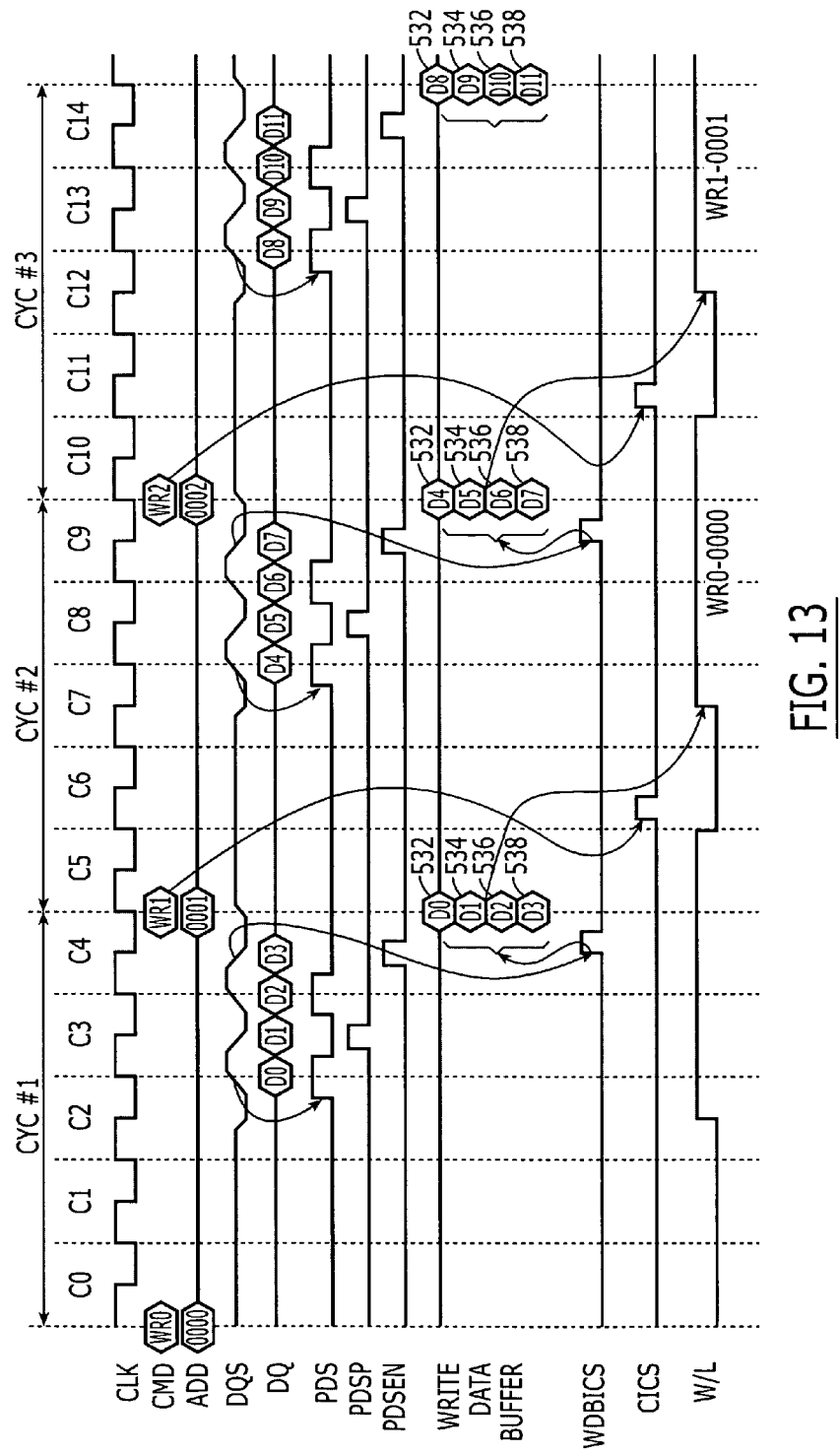
FIGS. 13–14 are timing diagrams illustrating a conventional four-bit prefetch operation in a fast cycle dynamic random access memory, such as was described in connection with FIG. 3 and in a dual data rate synchronous dynamic random access memory, respectively.

In FIG. 13, 4 bits input data for writing in a "0000" address are written in the corresponding memory cells after receiving the next write command (WR1), rather than being written in response to the previous write command (WR0). Thus, input data is written into the memory cell in response to a next command (WR1) in the next cycle (CYC #2) after being stored in a write data buffer in the previous cycle (CYC #1).

Figure 14:
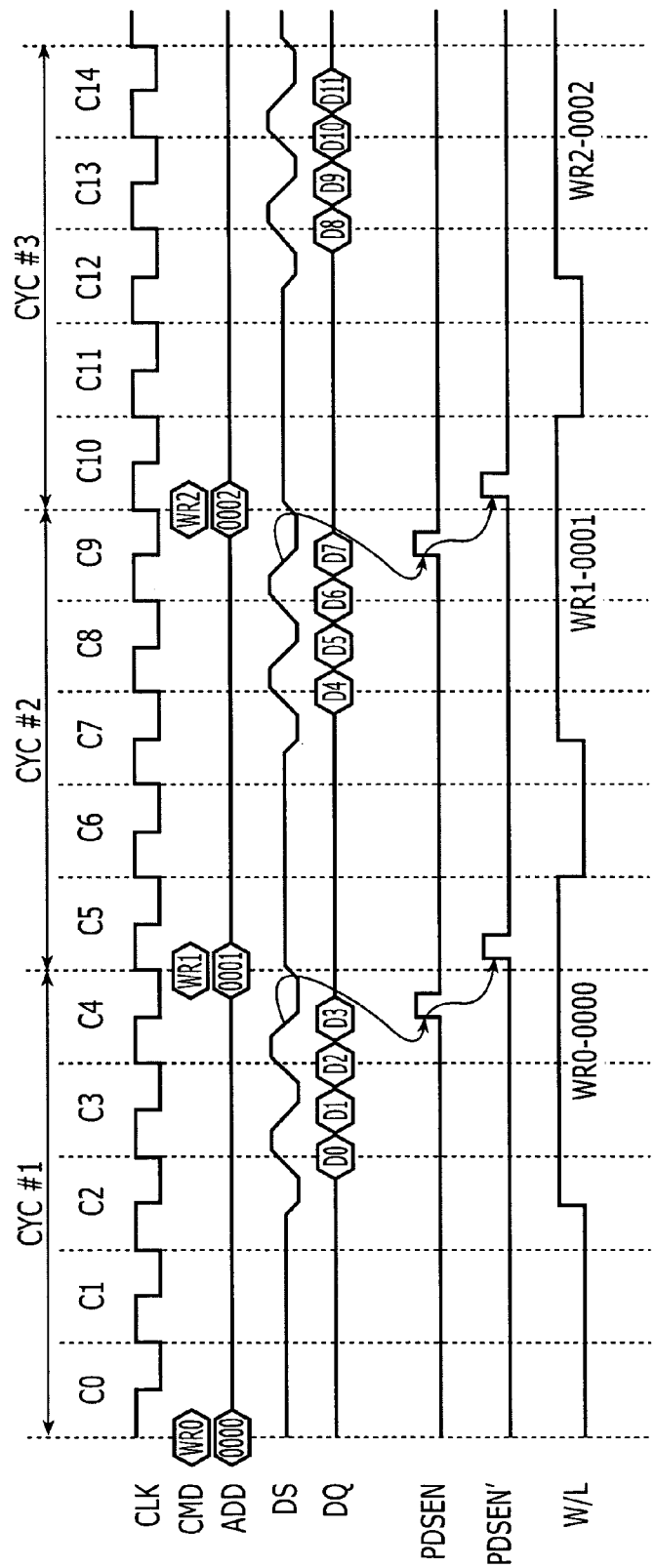

In FIG. 14, in the DDRSDRAM, 4 bits of input data for writing an "0000" are written in the corresponding memory cell in response to the corresponding write command (WR0), rather than in response to the next write command (WR1), as was shown in FIG. 13. In the DDRSDRAM, a write data buffer is not included so that input data is written directly into the memory cell without storing in a write data buffer.

Figure 15:
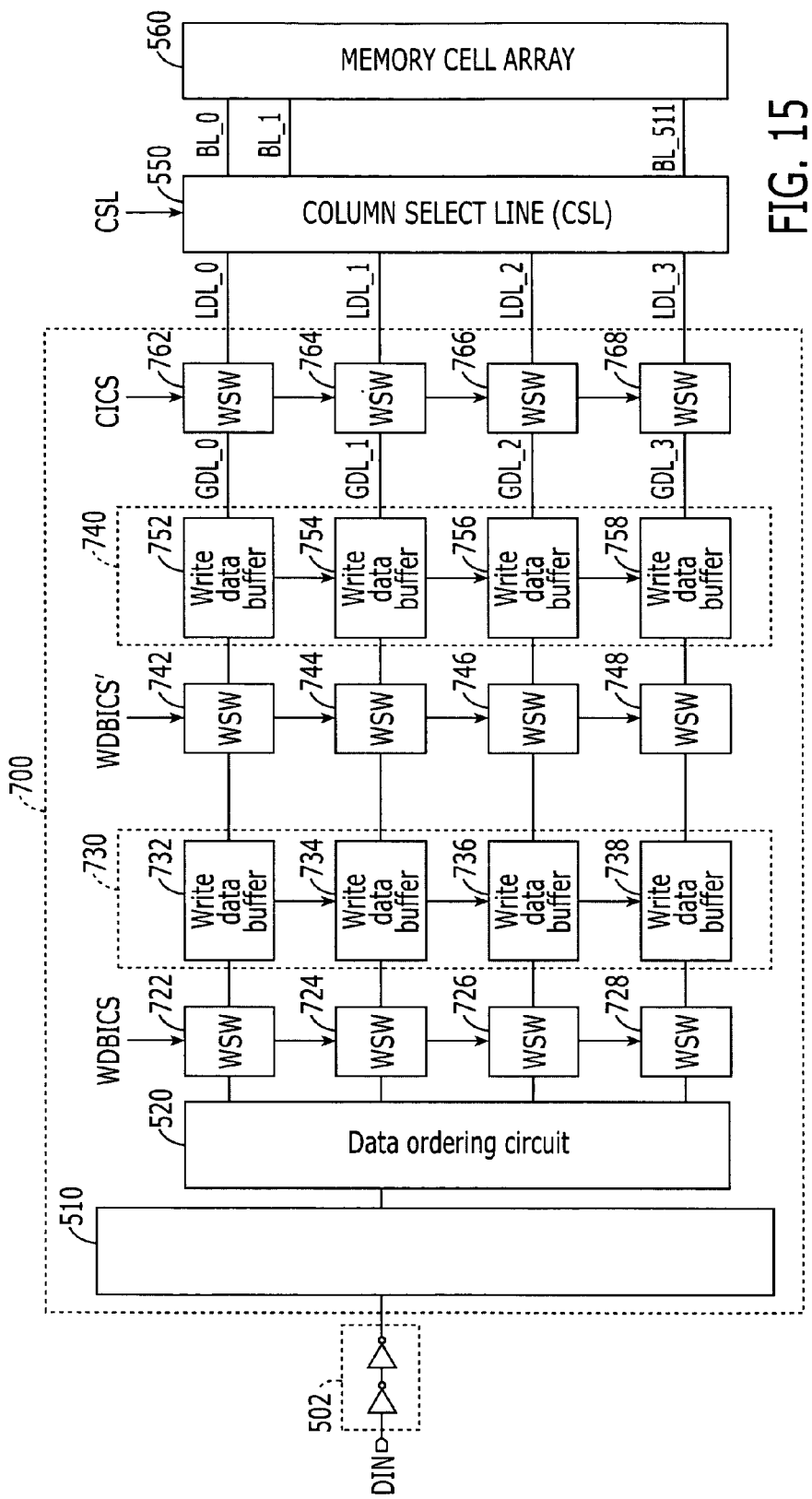
FIG. 15 is a detailed block diagram of embodiments of the present invention that were described generally in FIG. 8.

FIG. 15 is a more detailed block diagram of embodiments of the present invention that were generally described in FIG. 8, and which may also be referred to as second embodiments of the present invention. As was shown in FIG. 8, in these embodiments, a pipeline arrangement is used in the write data path so that only N global data lines and N local data lines are used in a 2N write data path. Thus, the number of global data lines and the number of local data lines may be reduced compared to a conventional write data path.

More specifically, referring to FIG. 15, the write data path 700 is configured as a pipeline stage that includes a serial-to-parallel converter 510 such as was already described, for example, in connection with FIG. 9, an optional data ordering circuit 520, first switches 722–728, first write data buffers 732–738, second switches 742–748, second write data buffers 752–758 and third switches 762–768. As shown in FIG. 15, these embodiments can provide fewer data lines than in embodiments of, for example, FIG. 9, because the number of global data lines (GDL0–GDL3) can be identical to a 4-bit prefetch scheme and the number of local data lines (LDL0–LDL3) also may be identical with a 4-bit prefetch scheme. The layout area of the memory device may thereby be decreased.

Still referring to FIG. 15, 8 bits of input data corresponding to BL8 are serially received in a buffer 502. The first 4 bits of serial input data are converted to 4 bits of parallel input data in the parallel data output circuit 510 and the first 4 bits of parallel input data are provided to an optional data ordering circuit 520. The data ordering circuit 520 can determine the output order of the 4 bits of parallel input data. The first 4 bits of parallel data are then stored in the first write data buffers 732–738 in response to a first write control signal (WDBICS) that is applied to write switches (WSW) 722–728. At the same time, the second 4 bits of serial input data are also converted into 4 bits of parallel input data in the parallel data output circuit 510 and then provided to the data ordering circuit 520 if present.

Then, the first 4 bits of parallel input data that are stored in the first write data buffers 732–738 are stored in the second write data buffers 752–758 in response to a second write control signal (WDBICS') that is applied to write switches (WSW) 742–748. At the same time, the second group of 4 bits of parallel data from the data ordering circuit 520 is also stored in the first write data buffers 732–738 in response to a second activation of the first write control signal (WDBICS). Thus, the first 4 bits and the second 4 bits of parallel input data are sequentially transferred to the memory cell array 560 and written to the selected memory cells in response to a plurality of signals WDBICS, WDBICS', CICS and CSL. As shown in FIG. 15, the signals WDBICS, WDBICS', CICS and CSL are twice enabled for the first 4 bits and again for the second 4 bits in order to provide the pipeline operation.

Precharge control circuits according to various embodiments of the present invention now will be described. These precharge control circuits may be used in connection with embodiments of FIGS. 6–12 and 15 to activate a word line of the memory cell array for a sufficient time to write the 2N data bits into the memory cell array as two groups of N parallel bits. In order to explain precharge control circuits according to various embodiments of the present invention, conventional precharge control circuits will first be described in connection with FIG. 16.

FIG. 16 is a timing diagram for a conventional precharge control circuit, such as may be used with FIG. 13. As shown in FIG. 16, in order to activate the word line so that all input data D0, D1, D2 and D3 can be written in the corresponding memory cell using a 4-bit prefetch scheme, the word line is enabled for a time T0.

Figure 5:
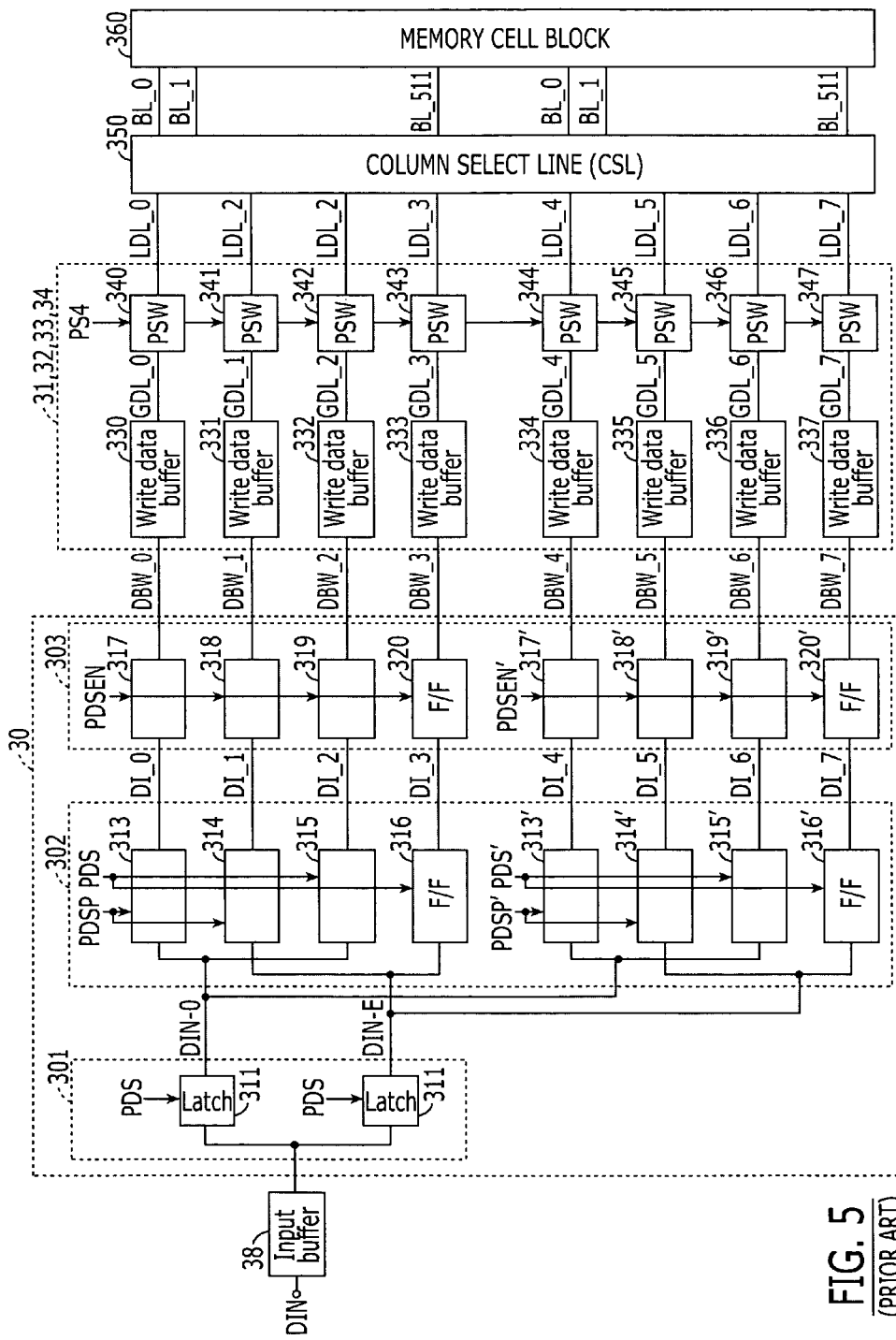
FIG. 5 is a block diagram of a conventional fast cycle dynamic random access memory that includes an eight-bit prefetch scheme.

FIG. 17 illustrates a conventional technique for enabling a word line in an 8 bit prefetch scheme as was described, for example, in FIG. 5 above. In FIG. 17, since 8 bits are written in parallel in an 8 bit prefetch scheme of FIG. 5, the time T0 that was used for the 4 bit prefetch scheme of FIG. 16 is also enough time to write 8 bits of input data into the memory cell with the 8 bit prefetch scheme. This is because the 8 bits of input data are converted to parallel input data in FIG. 5, and then written to the corresponding memory cells at the same time as was shown in FIG. 5.

FIG. 18 illustrates that a precharge scheme of FIGS. 16 and 17 should not be employed according to embodiments of the present invention. In particular, as shown in FIG. 18, if the same prefetch time T0 is used with embodiments of the present invention, the second half of the data bits may not be written into the memory cell array. In other words, input data bits D4–D7 may be missing. According to embodiments of the present invention, a precharge control circuit activates a word line of a memory cell array for a sufficient time to write the 2N data bits into the memory cell array as two groups of N parallel bits.

More specifically, as shown in FIG. 18, the T0 time that is used with a 4 bit prefetch scheme may not be enough time to write 8 bits of input data into the memory cell according to embodiments of the present invention. This is because, as was already described, 8 bits of input data are not written to memory cells at the same time according to some embodiments of the present invention. Stated differently, 8 bits of serial input data are divided into two groups (the first group and the second group). The first group of 4 bits of serial input data is converted into 4 bits of parallel input data. Then the second 4 bits of serial input data are converted into 4 bits of parallel data. After that, the first 4 bits of data are written in parallel into the memory cell array and then the second 4 bits of data are written into the memory cell array in parallel. Accordingly, in some embodiments of the present invention, the enabling time of a word line may be adjusted according to burst length (BL4, BL8).

Figure 19:
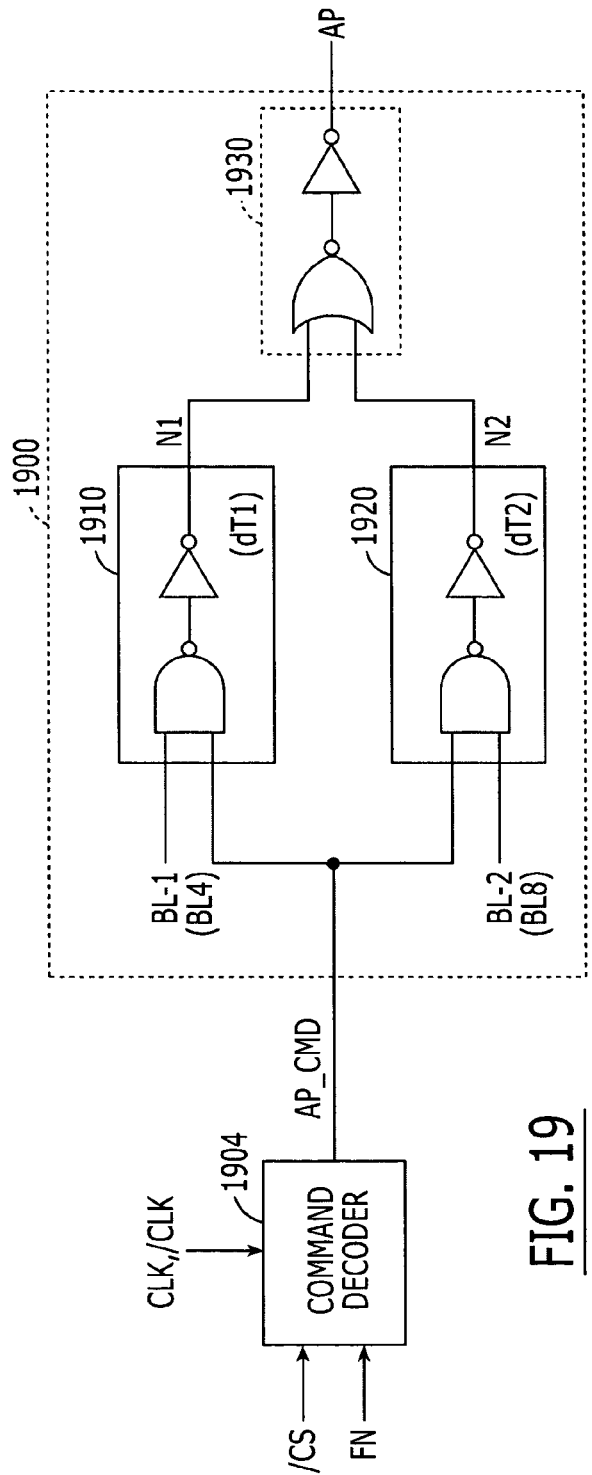
FIG. 19 is a schematic diagram of a precharge control circuit according to various embodiments of the present invention.

FIG. 19 is a schematic diagram of a precharge control circuit that activates a word line of a memory cell array for a sufficient time for it to write the 2N data bits into the memory cell array as two groups of N parallel bits, according to various embodiments of the present invention. As shown in FIG. 19, a precharge control circuit 1900 activates a word line of a memory cell array for a sufficient time to write the 2N data bits into the memory cell array as two groups of N parallel bits in a first precharge mode of the integrated circuit memory device. The precharge control circuit at 1900 activates the word line of the memory cell array for a sufficient time to write the N data bits into the memory cell array as one group of N parallel bits in a second precharge mode of the integrated circuit memory device.

More specifically, as shown in FIG. 19, the precharge control circuit 1900 outputs a precharge control signal (AP) after receiving burst length signals BL-1, BL-2 and a precharge command signal (AP_CMD) that is generated from a command decoder 1904. The command decoder 1904 can be responsive to external command signals /CS and FN and external clock signals, CLK,/CLK. For example, when the memory device is operated with 4-bit prefetch (BL4 is selected), BL-1 is enabled. Also, when the memory device is operated with 8-bit prefetch (BL8 is selected) according to embodiments of the present invention, BL-2 is enabled.

As shown in FIG. 19, the delay time DT1 for BL4 is smaller than the delay time DT2 for BL8. Accordingly, a first delay circuit 1910 provides a first delay DT1 that is relatively small and a second delay circuit 1920 provides a delay DT2 that is relatively large. In some embodiments, DT1 can be 3.5 clock cycles whereas DT2 can be 5.5 clock cycles. A combining circuit 1930 produces the precharge control signal AP from the first or second delaying circuits 1910 or 1920. Accordingly, the precharge control signal (AP) for BL4 is activated faster than the precharge control signal (AP) for the BL8 in order to deactivate the enabled word line. Thus, the WL enabling time for BL8 is increased compared to T0 as was shown in FIG. 18.

As shown in FIG. 13, the word line enable time for BL4 can be approximately 3.5 clock cycles. In contrast, as shown in FIG. 12, the WL enable time for BL8 can be approximately 5.5 clock cycles. In some embodiments, the mode register set can be configured to select the first or second precharge mode and the precharge control circuit 1910 may be responsive to the mode register set.

Figure 20:
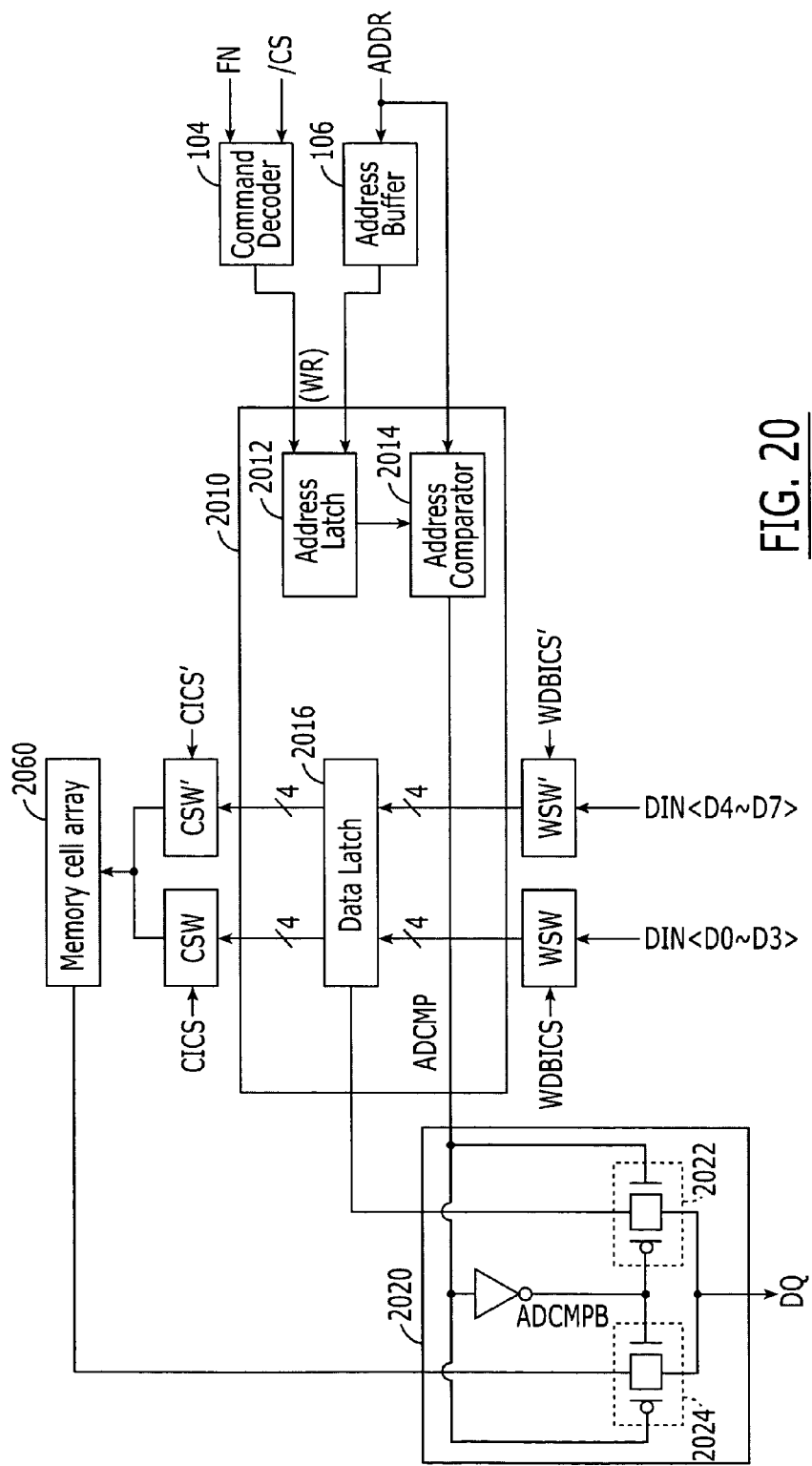
FIG. 20 is a block diagram of read/write data buffers and operations according to various embodiments of the present invention.

Additional details of write data buffers according to various embodiments of the present invention now will be provided. In particular, as shown in FIG. 20, at least one of the write data buffers, such as the write data buffers of FIGS. 6–9 and 15, are illustrated in FIG. 20. These write data buffers 2010 comprise an address latch 2012 that is configured to latch a write address. An address comparator 2014 is configured to compare a current address with the write address that is latched in the address latch 2012. A data latch 2016 is configured to latch the write data corresponding to the write address therein. In some embodiments, the current address is a read address and the integrated circuit memory device is further configured to output read data to the external terminal from the data latch 2016, rather than from the memory cell array, when the address comparator 2014 determines that the read address matches the write address that is latched in the address latch 2012. In other embodiments, the current address is a read address and the integrated circuit memory device is further configured to output read data to the external terminal from the memory cell array when the address comparator 2014 determines that the read address does not match the write address that is latched in the address latch 2012.

In particular, FIG. 16 illustrates a data read structure and process as well as a data write structure and process according to various embodiments of the present invention. As shown, write data buffer 2010 includes an address latch 2012, an address comparator 2014 and a data latch 2016. The address latch 2012 is controlled by a write command signal WR that is supplied from a command decoder, such as command decoder 104, and stores the input address that is received from an address buffer 106. At the same time, input data corresponding to the input address is stored in the data latch 2016. An address comparator 2014 compares a current input address with the input address stored in the address latch 2012 and outputs an address compare signal ADCMP to a DQ buffer 2020. When the current input address is the same as the stored input address, the ADCMP signal is activated, for example, to a high level. Thus, the read data stored to the data latch 2016 is output to the DQ pad through the first transfer gate 2022. However, when the current input address is different from the stored input address 2612, the ADCMP signal is deactivated. Under these circumstances, the read data stored in a memory cell array 560 is output to the DQ pad through the second transfer gate 2024.

Figure 21:
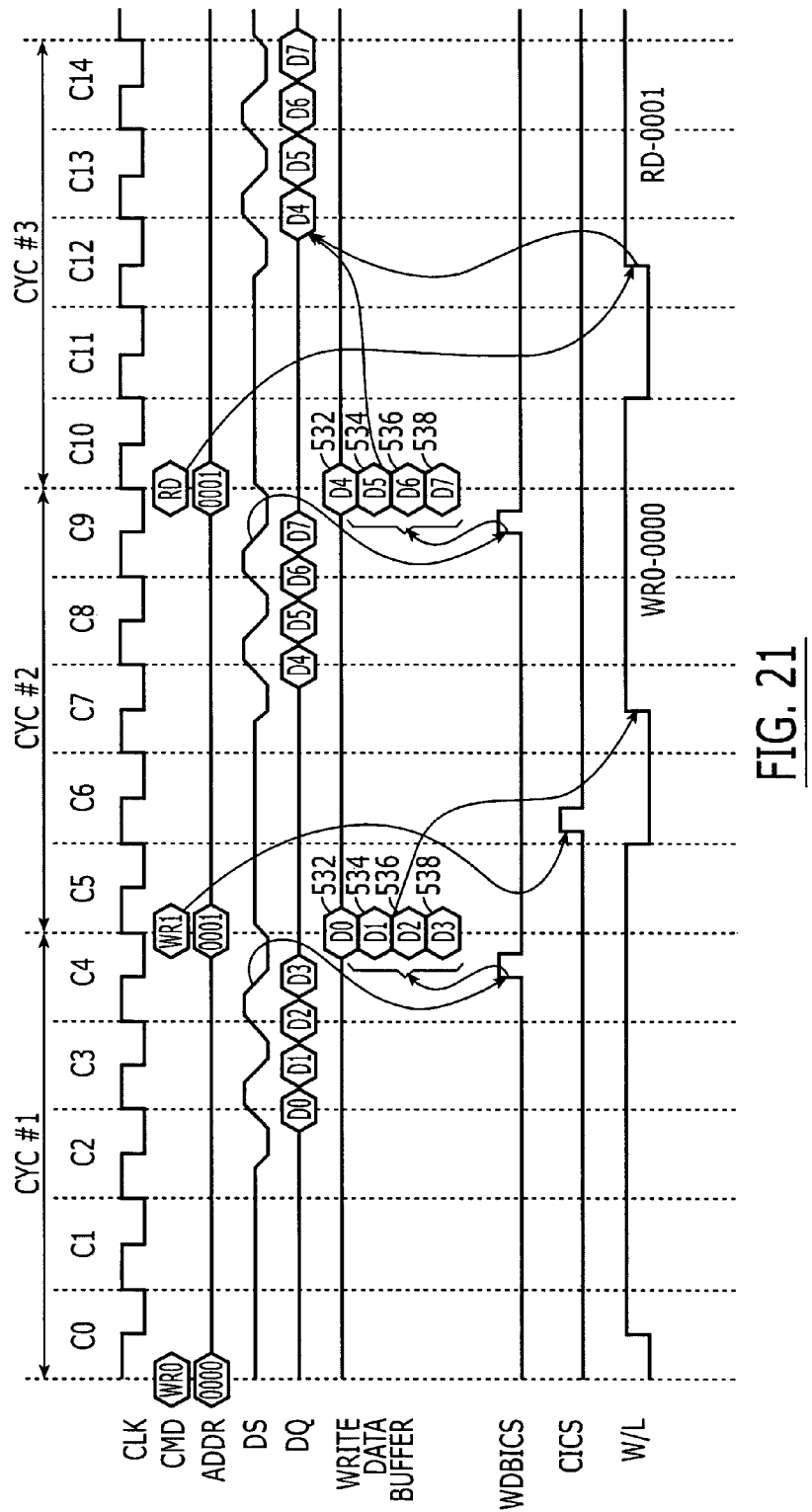
FIG. 21 is a timing diagram illustrating data read/write processes according to various embodiments of the present invention.

FIG. 21 is a timing diagram illustrating data read/write processes according to various embodiments of the present invention that were described, for example, in connection with FIGS. 15 and 18–20. As shown in FIG. 21, the pipelined storage of data bits takes place during two cycles (CYC#1 and CYC#2) including the expanded word line enable signal. Moreover, as also shown in FIG. 21, when the memory device receives a read command (RD) from a command decoder 104, the address comparator 2014 of FIG. 20 compares the current input address (0001 RD command input) with the input address (0001 WR1 command input) stored in the address latches. Since the same address is present, the read data is output directly from the write data buffer 532–538, rather than the memory cell array.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device comprising:
   a memory cell array including a plurality of memory cells; and
   a write data path that is configured to serially receive 2N data bits from an external terminal, the write data path comprising:
   2N write data buffers that are configured to store the 2N data bits;
   2N switches; and
   N data lines that are configured to connect at least N of the 2N switches to the memory cell array to write therein N data bits in parallel.

2. An integrated circuit device according to claim 1 wherein the write data path comprises:
   first and second serial-to-parallel converters that are connected to the external terminal; and
   N first global data lines and N second global data lines;
   wherein the 2N write data buffers comprise N first write data buffers and N second write data buffers;
   wherein the 2N switches comprise N first switches and N second switches;
   wherein the N first write data buffers are connected to the first serial-to-parallel converter, and a respective one of the N first global data lines is connected between a respective one of the N first switches and a respective one of the N first write data buffers;
   wherein the N second write data buffers are connected to the second serial-to-parallel converter, and a respective one of the N second global data lines is connected between a respective one of the N second switches and a respective one of the N second write data buffers;
   wherein the N data lines are N local data lines; and
   wherein a respective one of the N local data lines is connected between a respective one of the N first switches, a respective one of the N second switches and the memory cell array.

3. An integrated circuit device according to claim 2 wherein the write data path further comprises:
   first and second data ordering circuits, a respective one of which is connected between a respective one of the first and second serial-to-parallel converters and a respective one of the N first write data buffers and N second write data buffers.

4. An integrated circuit device according to claim 2 wherein the N first switches are responsive to a first control signal and the N second switches are responsive to a second control signal that is delayed in time from the first control signal.

5. An integrated circuit device according to claim 4 wherein the first and second control signals are generated with different delays from a write active signal.

6. An integrated circuit device according to claim 5 further comprising:
a command decoder that is responsive to a chip select command and a function command, to generate the write active signal; and
a control signal generation circuit that is responsive to the write active signal and is configured to generate the first and second control signals.

7. An integrated circuit device according to claim 6 wherein the command decoder is further configured to generate an active command and a read command in response to the chip select command and the function command.

8. An integrated circuit device according to claim 6 wherein the command decoder is further configured to generate a read command, a refresh command and a mode reset command in response to the chip select command and the function command.

9. An integrated circuit device according to claim 2 further comprising N third switches and N fourth switches, a respective one of the N third switches being connected between the first serial-to-parallel converter and a respective one of the N first write data buffers, and a respective one of the N fourth switches being connected between the second serial-to-parallel converter and a respective one of the N second write data buffers.

10. An integrated circuit device according to claim 9 wherein the N third switches are responsive to a third control signal and the N fourth switches are responsive to a fourth control signal that is delayed in time from the third control signal.

11. An integrated circuit device according to claim 10 wherein the third and fourth control signals are generated from respective offset falling edges of a data strobe signal.

12. An integrated circuit device according to claim 11 further comprising a data strobe counter that is responsive to the data strobe signal and that is configured to count falling edges of the data strobe signal and to generate the third and fourth control signals from respective offset falling edges of the data strobe signal.

13. An integrated circuit device according to claim 2 wherein the first serial-to-parallel converter is responsive to a first set of internal data strobe signals and wherein the second serial-to-parallel converter is responsive to a second set of internal data strobe signals.

14. An integrated circuit device according to claim 2 wherein the first serial-to-parallel converter and the second serial-to-parallel converter are both responsive to a same set of internal data strobe signals.

15. An integrated circuit device comprising:
a memory cell array including a plurality of memory cells;
a write data path that is configured to serially receive 2N data bits from an external terminal, the write data path including:
2N write data buffers that are configured to store the 2N data bits;
2N switches;
N local data lines that are configured to connect at least N of the 2N switches to the memory cell array to write therein N data bits in parallel;
a serial-to-parallel converter that is connected to the external terminal;
N global data lines;
wherein the 2N write data buffers comprise N first write data buffers and N second write data buffers;
wherein the 2N switches comprise N first switches and N second switches;
wherein the N first write data buffers are connected to the serial-to-parallel converter and a respective one of the N first write data buffers is connected to a respective one of the N first switches;
wherein a respective one of the N second write data buffers is connected to a respective one of the N first switches, and a respective one of the N global data lines is connected between a respective one of the N second switches and a respective one of the N second write data buffers; and
wherein a respective one of the N local data lines is connected between a respective one of the N second switches and the memory cell array.

16. An integrated circuit device according to claim 15 wherein the write data path further comprises:
a data ordering circuit that is connected between the serial-to-parallel converter and a respective one of the N first write data buffers.

17. An integrated circuit device according to claim 15 further comprising N third switches, a respective one of which is connected between the serial-to-parallel converter and a respective one of the N first write data buffers.

18. An integrated circuit device according to claim 17 wherein the N third switches are responsive to a first control signal and the N first switches are responsive to a second control signal that is delayed in time from the first control signal.

19. An integrated circuit device according to claim 18 wherein the first and second control signals are generated from respective offset falling edges of a data strobe signal.

20. An integrated circuit device comprising:
a memory cell array including a plurality of memory cells;
a write data path that is configured to serially receive 2N data bits from an external terminal, the write data path including:
2N write data buffers that are configured to store the 2N data bits;
2N switches;
N local data lines that are configured to connect at least N of the 2N switches to the memory cell array to write therein N data bits in parallel; and
a precharge control circuit that activates a word line of the memory cell array for a sufficient time to write the 2N data bits into the memory cell array as two groups of N parallel bits.

21. An integrated circuit device according to claim 20:
wherein the precharge control circuit activates a word line of the memory cell array for a sufficient time to write the 2N data bits into the memory cell array as two groups of N parallel bits in a first precharge mode of the integrated circuit device; and
wherein the precharge control circuit activates a word line of the memory cell array for a sufficient time to write the N data bits into the memory cell array as one group of N parallel bits in a second precharge mode of the integrated circuit device.

22. An integrated circuit device according to claim 21 further comprising a mode register set that is configured to select the first or second precharge mode, wherein the precharge control circuit is responsive to the mode register set.

23. An integrated circuit device according to claim 20 wherein the precharge control circuit comprises:
a first delay element that is responsive to a first precharge mode signal, the first delay element having a first delay and being configured to activate the word line of the memory cell array for a sufficient time to write the 2N data bits into the memory cell array as two groups of N parallel bits; and a second delay element that is responsive to a second precharge mode signal, the second delay element having a second delay that is shorter than the first delay and being configured to activate the word line of the memory cell array for a sufficient time to write the N data bits into the memory cell array as one group of N parallel bits.

24. An integrated circuit device comprising:
a memory cell array including a plurality of memory cells;
a write data path that is configured to serially receive 2N data bits from an external terminal, the write data path including:
2N write data buffers that are configured to store the 2N data bits;
2N switches;
N local data lines that are configured to connect at least N of the 2N switches to the memory cell array to write therein N data bits in parallel;
wherein the write data buffer comprises:
an address latch that is configured to latch a write address;
an address comparator that is configured to compare a current address with the write address that is latched in the address latch; and
a data latch that is configured to latch the write data corresponding to the write address therein.

25. An integrated circuit device according to claim 24 wherein the current address is a read address and wherein the integrated circuit device is further configured to output read data to the external terminal from the data latch rather than from the memory cell array, when the address comparator determines that the read address matches the write address that is latched in the address latch.

26. An integrated circuit device according to claim 24 wherein the current address is a read address and wherein the integrated circuit device is further configured to output read data to the external terminal from the memory cell array, when the address comparator determines that the read address does not match the write address that is latched in the address latch.

27. An integrated circuit device comprising:
a memory cell array that is configured to store therein a plurality of data bits in parallel; and
a write data path that is configured to serially receive twice the plurality of data bits from an external terminal, to write a first half of the data bits into the memory cell array in parallel and to subsequently write a second half of the data bits into the memory cell array in parallel.

28. An integrated circuit device according to claim 27, wherein the write data path is configured to serially receive the first half of the data bits and then serially receive the second half of the data bits, to store the first half of the data bits in a first set of write data buffers and to store the second half of the data bits in a second set of write data buffers, and to write the first half of the data bits into the memory cell array in parallel and to subsequently write the second half of the data bits into the memory cell array in parallel from the respective first and second sets of write data buffers over a common set of local data lines.

29. An integrated circuit device according to claim 27, wherein the write data path is configured to serially receive the first half of the data bits and then serially receive the second half of the data bits, to store the first half of the data bits in a first set of write data buffers, to shift the first half of the data bits from the first set of write data buffers to a second set of write data buffers and to store the second half of the data bits in the first set of write data buffers, to write the first half of the data bits from the second set of write data buffers into the memory cell array, to shift the second half of the data bits from the first set of write data buffers to the second set of write data buffers and to write the second half of the data bits from the second set of write data buffers into the memory cell array.

30. An integrated circuit device according to claim 27 further comprising:
a precharge control circuit that activates a word line of the memory cell array for a sufficient time to write the first half of the data bits into the memory cell array in parallel and to subsequently write the second half of the data bits into the memory cell array in parallel.

31. A method of operating an integrated circuit device having a memory cell array that is configured to store therein a plurality of data bits in parallel, the method comprising:
serially receiving twice the plurality of data bits from an external terminal;
storing the data bits that are received in a plurality of write data buffers;
writing a first half of the data bits from the write data buffers into the memory cell array in parallel; and then
writing a second half of the data bits from the write data buffers into the memory cell array in parallel.

32. A method according to claim 31:
wherein serially receiving comprises serially receiving the first half of the data bits and then serially receiving the second half of the data bits;
wherein storing comprises storing the first half of the data bits in a first set of write data buffers and storing the second half of the data bits in a second set of write data buffers; and
wherein writing a first half of the data bits and writing a second half of the data bits are performed from the respective first and second sets of write data buffers over a common set of local data lines.

33. A method according to claim 32 wherein writing a first half of the data bits is performed responsive to a first control signal and wherein writing a second half of the data bits is performed responsive to a second control signal that is delayed in time from the first control signal.

34. A method according to claim 33 wherein the first and second control signals are generated with different delays from a write active signal.

35. A method according to claim 33 wherein storing the first half of the data bits in a first set of write data buffers is performed responsive to a third control signal and wherein storing the second half of the data bits in a second set of write data buffers is performed responsive to a fourth control signal that is delayed in time from the third control signal.

36. A method according to claim 35 wherein the third and fourth control signals are generated from respective offset falling edges of a data strobe signal.

37. A method according to claim 36 further comprising:
counting falling edges of the data strobe signal and generating the third and fourth control signals from respective offset falling edges of the data strobe signal.

38. A method according to claim 31:
wherein serially receiving comprises serially receiving the first half of the data bits and then serially receiving the second half of the data bits;
wherein storing comprises storing the first half of the data bits in a first set of write data buffers, shifting the first half of the data bits from the first set of write data buffers to a second set of write data buffers and storing the second half of the data bits in the first set of write data buffers;

wherein writing a first half of the data bits comprises writing the first half of the data bits from the second set of write data buffers into the memory cell array; and wherein writing a second half of the data bits comprises shifting the second half of the data bits from the first set of write data buffers to the second set of write data buffers and writing the second half of the data bits from the second set of write data buffers into the memory cell array.

39. A method according to claim 38 wherein data bits are stored in the first set of write data buffers responsive to a first control signal and wherein data bits are shifted from the first set of write data buffers to the second set of write data buffers responsive to a second control signal that is delayed in time from the first control signal.

40. A method according to claim 39 wherein the first and second control signals are generated from respective offset falling edges of a data strobe signal.

41. A method according to claim 31 further comprising:

activating a word line of the memory cell array for a sufficient time to write the first half of the data bits into the memory cell array in parallel and to subsequently write the second half of the data bits into the memory cell array in parallel.

* * * * *